United States Patent
Russell et al.

(10) Patent No.: US 12,245,438 B2
(45) Date of Patent: Mar. 4, 2025

(54) DENSE PIERS FOR THREE-DIMENSIONAL MEMORY ARRAYS

(71) Applicant: Micron Technology, Inc., Boise, ID (US)

(72) Inventors: Stephen W. Russell, Boise, ID (US); Enrico Varesi, Milan (IT); David H. Wells, Boise, ID (US); Paolo Fantini, Vimercate (IT); Lorenzo Fratin, Buccinasco (IT)

(73) Assignee: Micron Technology, Inc., Boise, ID (US)

( * ) Notice: Subject to any disclaimer, the term of this patent is extended or adjusted under 35 U.S.C. 154(b) by 411 days.

(21) Appl. No.: 17/656,287

(22) Filed: Mar. 24, 2022

(65) Prior Publication Data

US 2023/0309326 A1    Sep. 28, 2023

(51) Int. Cl.
*H01L 27/24* (2006.01)
*H01L 45/00* (2006.01)
*H10B 63/00* (2023.01)
*H10N 70/00* (2023.01)

(52) U.S. Cl.
CPC ......... *H10B 63/845* (2023.02); *H10N 70/066* (2023.02)

(58) Field of Classification Search
CPC .................................................. H10N 70/066
See application file for complete search history.

(56) References Cited

U.S. PATENT DOCUMENTS 10,020,315 B1\* 7/2018 Kato ..................... H10B 41/10
2021/0091108 A1\* 3/2021 Naruke ................. G11C 16/24

\* cited by examiner

*Primary Examiner* — Peniel M Gumedzoe
(74) *Attorney, Agent, or Firm* — Holland & Hart LLP

(57) ABSTRACT

Methods, systems, and devices for dense piers for three-dimensional memory arrays are described. In some examples, a memory device may include pier structures formed in contact with features formed from alternating layers of materials deposited over a substrate. For example, a memory device may include alternating layers of a first material and a second material. In some examples, the alternating layers may be formed into a pair of interleaved comb structures. Pier structures may be formed in contact with the cross sectional patterns, and may provide mechanical support of cross-sectional pattern of the remaining material. In some examples, the piers may further act as a separator between memory cells or other features of the memory device. For example, the piers may extend into at least a portion of the interleaved comb structures, and may accordingly act as barriers during subsequent depositions of materials.

11 Claims, 21 Drawing Sheets

SECTION A-A

▓ Unselected Memory Cell 105      ■ Selected Memory Cell 105-a

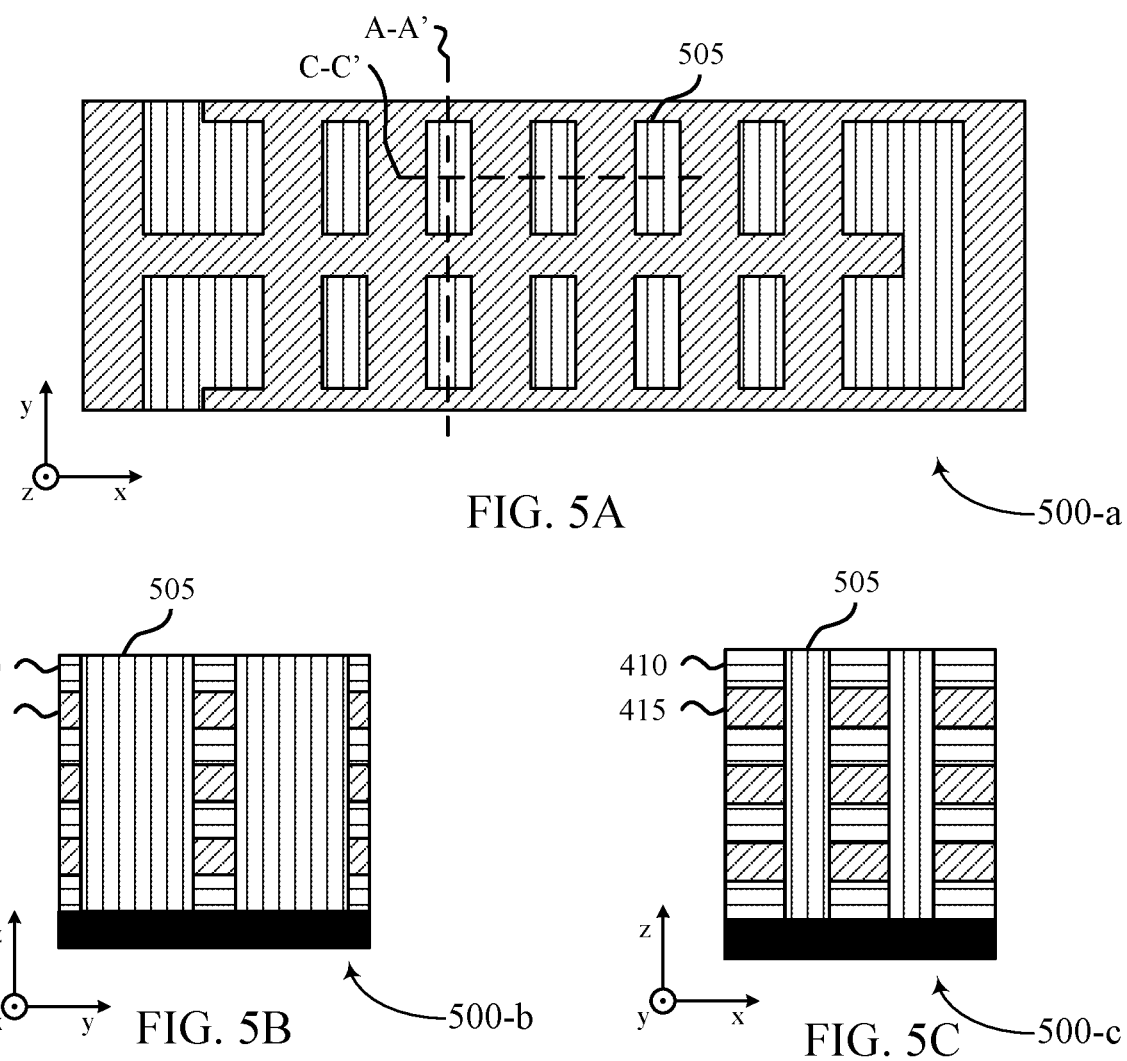

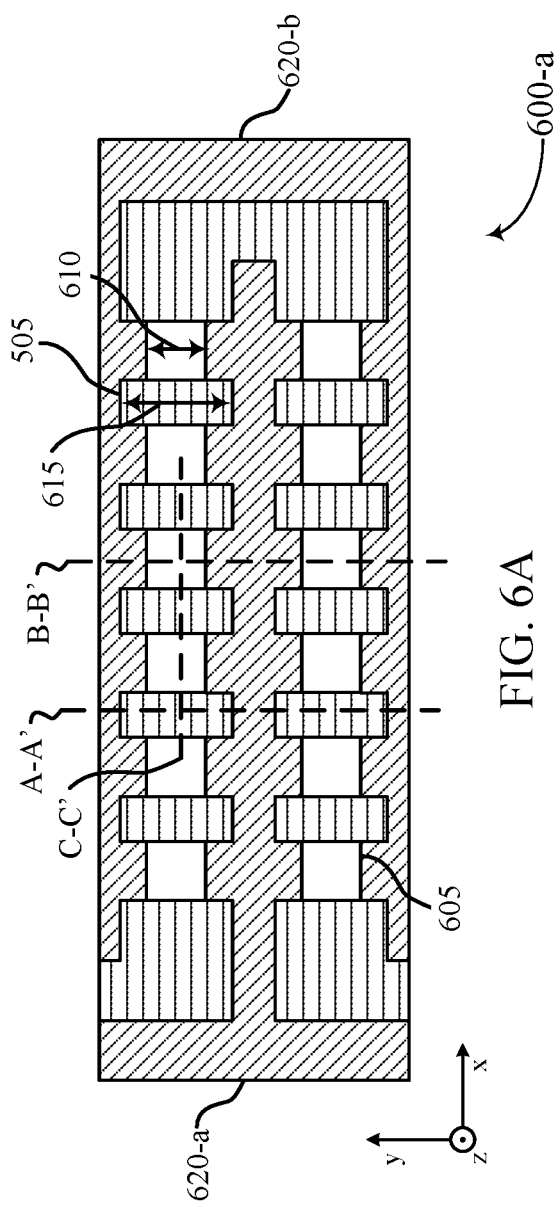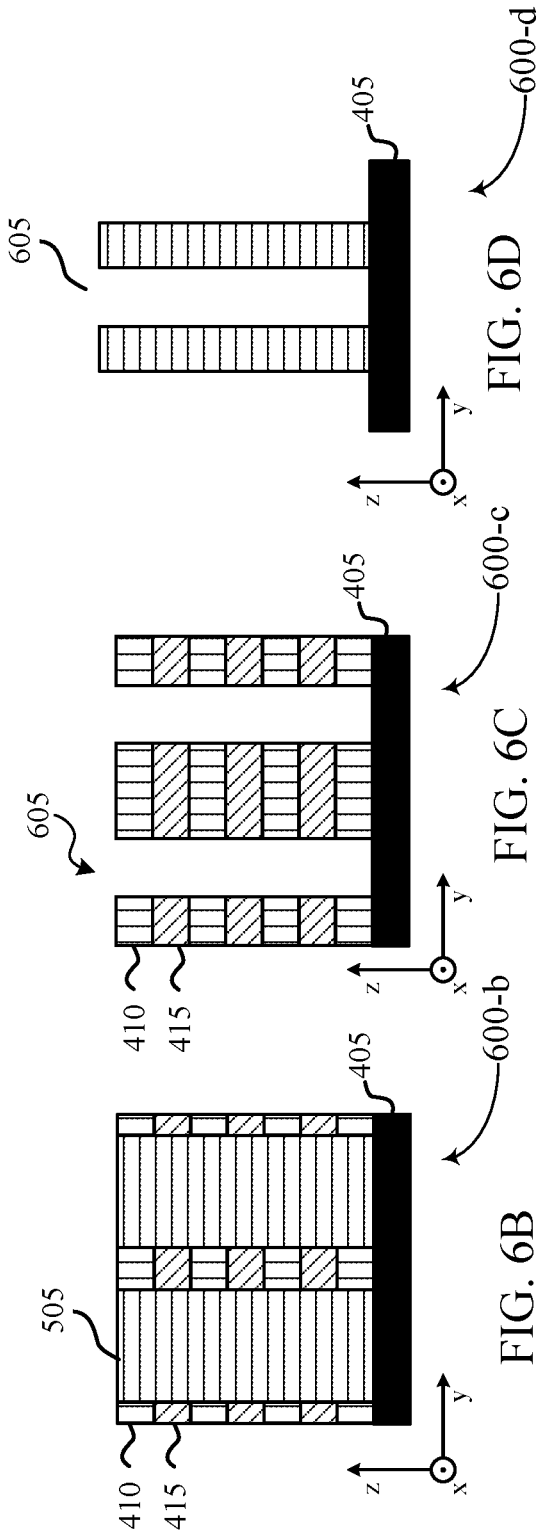

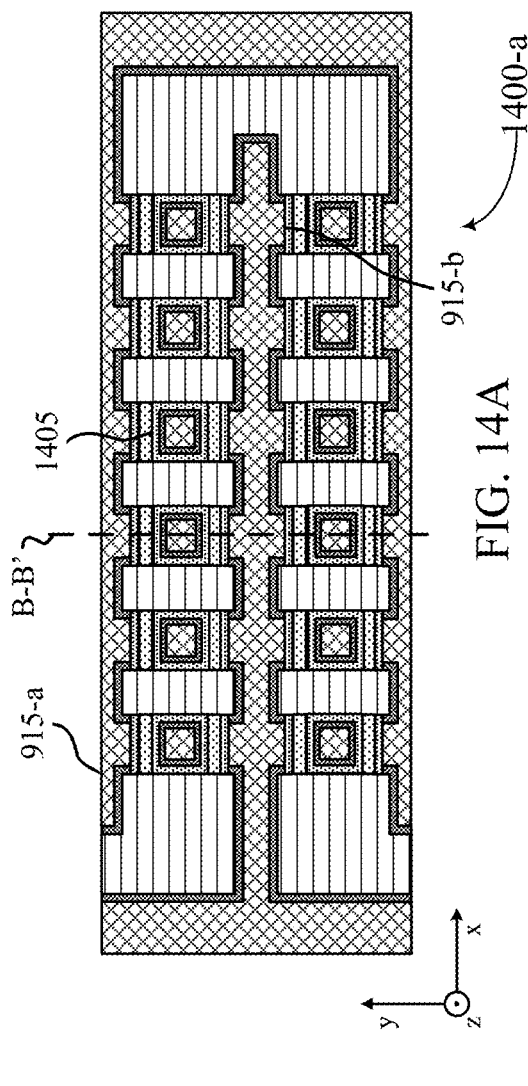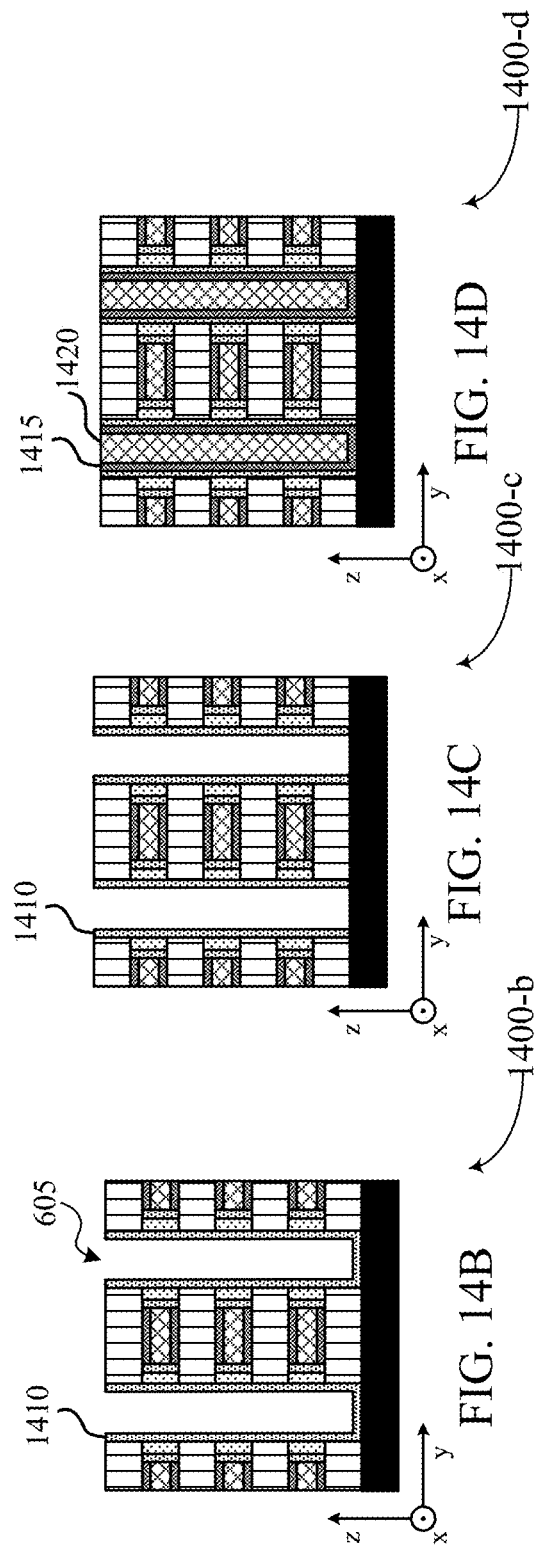

DENSE PIERS FOR THREE-DIMENSIONAL MEMORY ARRAYS

FIELD OF TECHNOLOGY

The following relates to one or more systems for memory, including dense piers for three-dimensional memory arrays.

BACKGROUND

Memory devices are widely used to store information in various electronic devices such as computers, user devices, wireless communication devices, cameras, digital displays, and the like. Information is stored by programming memory cells within a memory device to various states. For example, binary memory cells may be programmed to one of two supported states, often denoted by a logic 1 or a logic 0. In some examples, a single memory cell may support more than two states, any one of which may be stored. To access the stored information, a component may read (e.g., sense, detect, retrieve, identify, determine, evaluate) a stored state in the memory device. To store information, a component may write (e.g., program, set, assign) the state in the memory device.

Various types of memory devices and memory cells exist, including magnetic hard disks, random access memory (RAM), read-only memory (ROM), dynamic RAM (DRAM), synchronous dynamic RAM (SDRAM), static RAM (SRAM), ferroelectric RAM (FeRAM), magnetic RAM (MRAM), resistive RAM (RRAM), flash memory, phase change memory (PCM), self-selecting memory, chalcogenide memory technologies, and others. Memory cells may be described in terms of volatile configurations or non-volatile configurations. Memory cells configured in a non-volatile configuration may maintain stored logic states for extended periods of time even in the absence of an external power source. Memory cells configured in a volatile configuration may lose stored states when disconnected from an external power source.

BRIEF DESCRIPTION OF THE DRAWINGS

FIGS. 5A, 5B, and 5C illustrate examples of a step of a manufacturing process of a memory array that supports dense piers for three-dimensional memory arrays in accordance with examples as disclosed herein.

FIGS. 6A, 6B, 6C, and 6D illustrate examples of a step of a manufacturing process of a memory array that supports dense piers for three-dimensional memory arrays in accordance with examples as disclosed herein.

FIGS. 14A, 14B, 14C, and 14D illustrate examples of a step of a manufacturing process of a memory array that supports dense piers for three-dimensional memory arrays in accordance with examples as disclosed herein.

DETAILED DESCRIPTION

Figure 1:
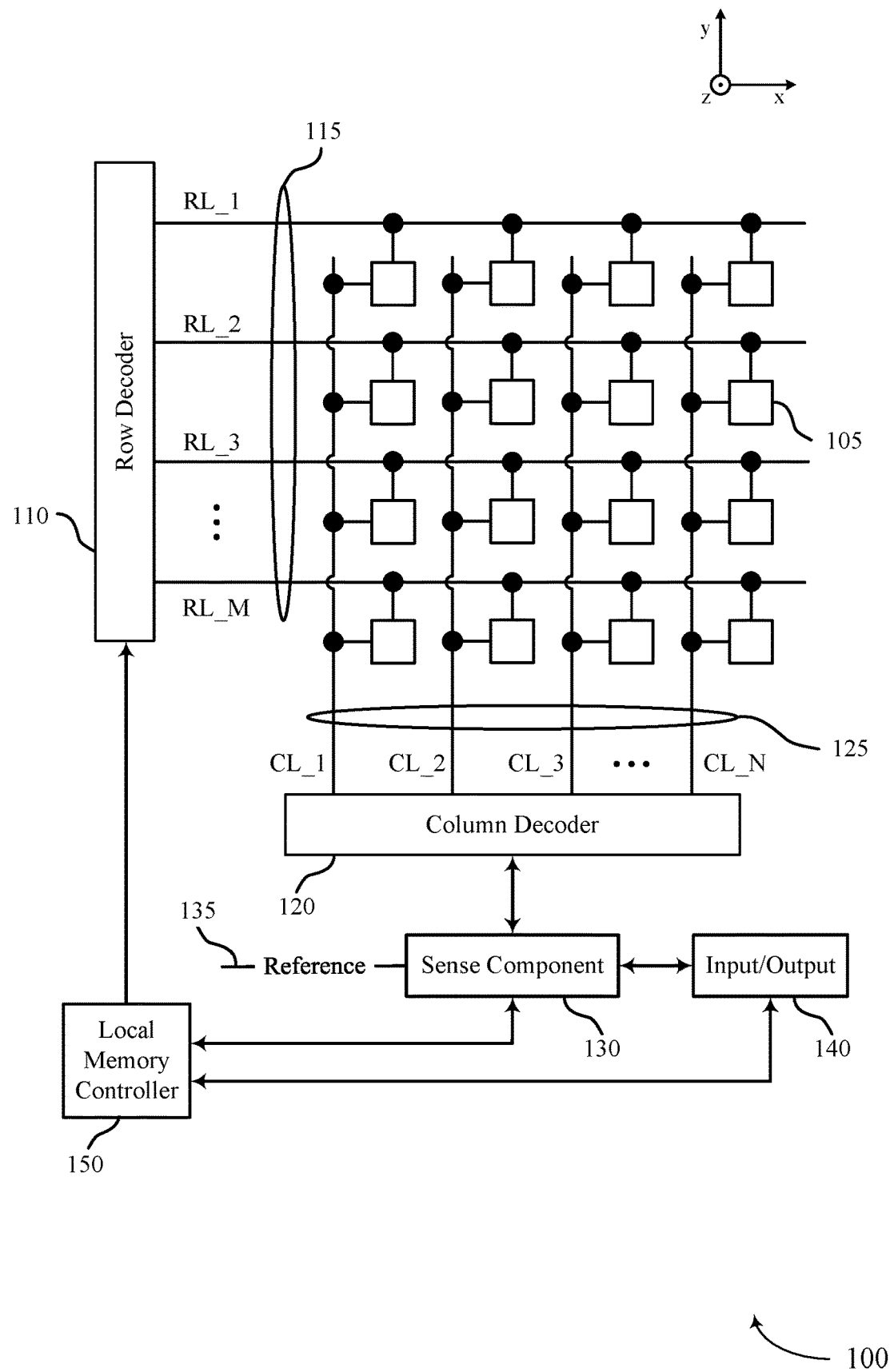
FIG. 1 illustrates an example of a memory array that supports dense piers for three-dimensional memory arrays in accordance with examples as disclosed herein.

In some semiconductor manufacturing operations, voids may be formed between layers of material deposited over a substrate, and other materials may be deposited in the voids (e.g., between the layers of material) to form various circuit structures. For example, in some memory applications, voids may be formed between layers of a dielectric material, and features of a memory array, such as access lines or memory cells (e.g., of different levels of the memory array), may be formed from materials deposited between the layers of the dielectric material. However, in some examples, features formed from the layers of dielectric material may lack sufficient mechanical support for subsequent processing, which may be associated with mechanical instability (e.g., buckling, deformation) of the features formed from the layers of dielectric material during processing. In some examples, such mechanical instability may lead to poor tolerances or failure to implement circuit structures of a semiconductor device, among other issues.

In accordance with examples as disclosed herein, a semiconductor device (e.g., a memory die) may include pier structures formed in contact with features formed from alternating layers of materials deposited over a substrate, which may provide mechanical support for subsequent processing. For example, a memory die may include alternating layers of a first material and a second material, which may be formed into various cross-sectional patterns. In some examples, the alternating layers may be formed into a pair of interleaved comb structures. Pier structures may be formed in contact with the cross sectional patterns such that, when either the first material or the second material is removed (e.g., in a selective etching operation) to form voids (e.g., along a direction relative to the substrate), the pier structures provide mechanical support of the cross-sectional pattern of the remaining material. By implementing such pier structures, the voids may be formed with improved stability or tolerances, such that formation of features within the voids (e.g., circuit structures, access lines, memory cells) may be performed with reduced variability or otherwise improved consistency. In some examples, the piers may further act as a separator between memory cells or other features of the memory die. For example, the piers may extend into at least a portion of the interleaved comb structures, and may accordingly act as barriers during subsequent depositions of materials.

Features of the disclosure are initially described in the context of memory devices and arrays with reference to FIGS. 1, 2, 3A, and 3B. Features of the disclosure are described in the context of steps of a manufacturing process of a memory array with reference to FIGS. 4A-20. These and other features of the disclosure are further illustrated by and described with reference to an apparatus diagram and flowcharts that relate to dense piers for three-dimensional memory arrays as described with reference to FIGS. 21-22.

FIG. 1 illustrates an example of a memory device 100 that supports dense piers for three-dimensional memory arrays in accordance with examples as disclosed herein. In some examples, the memory device 100 may be referred to as or include a memory die, a memory chip, or an electronic memory apparatus. The memory device 100 may be operable to provide locations to store information (e.g., physical memory addresses) that may be used by a system (e.g., a host device coupled with the memory device 100, for storing information, for reading information).

The memory device 100 may include one or more memory cells 105 that each may be programmable to store different logic states (e.g., a programmed one of a set of two or more possible states). For example, a memory cell 105 may be operable to store one bit of information at a time (e.g., a logic 0 or a logic 1). In some examples, a memory cell 105 (e.g., a multi-level memory cell 105) may be operable to store more than one bit of information at a time (e.g., a logic 00, logic 01, logic 10, a logic 11). In some examples, the memory cells 105 may be arranged in an array.

A memory cell 105 may store a logic state using a configurable material, which may be referred to as a memory element, a storage element, a memory storage element, a material element, a material memory element, a material portion, or a polarity-written material portion, among others. A configurable material of a memory cell 105 may refer to a chalcogenide-based storage component. For example, a chalcogenide storage element may be used in a phase change memory cell, a thresholding memory cell, or a self-selecting memory cell, among other architectures.

In some examples, the material of a memory cell 105 may include a chalcogenide material or other alloy including selenium (Se), tellurium (Te), arsenic (As), antimony (Sb), carbon (C), germanium (Ge), silicon (Si), or indium (In), or various combinations thereof. In some examples, a chalcogenide material having primarily selenium (Se), arsenic (As), and germanium (Ge) may be referred to as a SAG-alloy. In some examples, a SAG-alloy may also include silicon (Si) and such chalcogenide material may be referred to as SiSAG-alloy. In some examples, SAG-alloy may include silicon (Si) and indium (In) or a combination thereof and such chalcogenide materials may be referred to as SiSAG-alloy or InSAG-alloy, respectively, or a combination thereof. In some examples, the chalcogenide glass may include additional elements such as hydrogen (H), oxygen (O), nitrogen (N), chlorine (CI), or fluorine (F), each in atomic or molecular forms.

In some examples, a memory cell 105 may be an example of a phase change memory cell. In such examples, the material used in the memory cell 105 may be based on an alloy (such as the alloys listed above) and may be operated so as to change to different physical state (e.g., undergo a phase change) during normal operation of the memory cell 105. For example, a phase change memory cell 105 may be associated with a relatively disordered atomic configuration (e.g., a relatively amorphous state) and a relatively ordered atomic configuration (e.g., a relatively crystalline state). A relatively disordered atomic configuration may correspond to a first logic state (e.g., a RESET state, a logic 0) and a relatively ordered atomic configuration may correspond to a second logic state (e.g., a logic state different than the first logic state, a SET state, a logic 1).

In some examples (e.g., for thresholding memory cells 105, for self-selecting memory cells 105), some or all of the set of logic states supported by the memory cells 105 may be associated with a relatively disordered atomic configuration of a chalcogenide material (e.g., the material in an amorphous state may be operable to store different logic states). In some examples, the storage element of a memory cell 105 may be an example of a self-selecting storage element. In such examples, the material used in the memory cell 105 may be based on an alloy (e.g., such as the alloys listed above) and may be operated so as to undergo a change to a different physical state during normal operation of the memory cell 105. For example, a self-selecting memory cell 105 may have a high threshold voltage state and a low threshold voltage state. A high threshold voltage state may correspond to a first logic state (e.g., a RESET state, a logic 0) and a low threshold voltage state may correspond to a second logic state (e.g., a logic state different than the first logic state, a SET state, a logic 1).

During a write operation (e.g., a programming operation) of a self-selecting or thresholding memory cell 105, a polarity used for a write operation may influence (e.g., determine, set, program) a behavior or characteristic of the material of the memory cell 105, such as a thresholding characteristic (e.g., a threshold voltage) of the material. A difference between thresholding characteristics of the material of the memory cell 105 for different logic states stored by the material of the memory cell 105 (e.g., a difference between threshold voltages when the material is storing a logic state '0' versus a logic state '1') may correspond to the read window of the memory cell 105.

The memory device 100 may include access lines (e.g., row lines 115 each extending along an illustrative x-direction, column lines 125 each extending along an illustrative y-direction) arranged in a pattern, such as a grid-like pattern. Access lines may be formed with one or more conductive materials. In some examples, row lines 115, or some portion thereof, may be referred to as word lines. In some examples, column lines 125, or some portion thereof, may be referred to as digit lines or bit lines. References to access lines, or their analogues, are interchangeable without loss of understanding. Memory cells 105 may be positioned at intersections of access lines, such as row lines 115 and the column lines 125. In some examples, memory cells 105 may also be arranged (e.g., addressed) along an illustrative z-direction, such as in an implementation of sets of memory cells 105 being located at different levels (e.g., layers, decks, planes) along the illustrative z-direction. In some examples, a memory device 100 that includes memory cells 105 at different levels may be supported by a different configuration of access lines, decoders, and other supporting circuitry than shown.

Operations such as read operations and write operations may be performed on the memory cells 105 by activating access lines such as one or more of a row line 115 or a column line 125, among other access lines associated with alternative configurations. For example, by activating a row line 115 and a column line 125 (e.g., applying a voltage to the row line 115 or the column line 125), a memory cell 105 may be accessed in accordance with their intersection. An intersection of a row line 115 and a column line 125, among other access lines, in various two-dimensional or three-dimensional configuration may be referred to as an address of a memory cell 105. In some examples, an access line may be a conductive line coupled with a memory cell 105 and may be used to perform access operations on the memory cell 105. In some examples, the memory device 100 may perform operations responsive to commands, which may be issued by a host device coupled with the memory device 100 or may be generated by the memory device 100 (e.g., by a local memory controller 150).

Accessing the memory cells 105 may be controlled through one or more decoders, such as a row decoder 110 or a column decoder 120, among other examples. For example, a row decoder 110 may receive a row address from the local memory controller 150 and activate a row line 115 based on the received row address. A column decoder 120 may receive a column address from the local memory controller 150 and may activate a column line 125 based on the received column address.

The sense component 130 may be operable to detect a state (e.g., a material state, a resistance state, a threshold state) of a memory cell 105 and determine a logic state of the memory cell 105 based on the detected state. The sense component 130 may include one or more sense amplifiers to convert (e.g., amplify) a signal resulting from accessing the memory cell 105 (e.g., a signal of a column line 125 or other access line). The sense component 130 may compare a signal detected from the memory cell 105 to a reference 135 (e.g., a reference voltage, a reference charge, a reference current). The detected logic state of the memory cell 105 may be provided as an output of the sense component 130 (e.g., to an input/output component 140), and may indicate the detected logic state to another component of the memory device 100 or to a host device coupled with the memory device 100.

The local memory controller 150 may control the accessing of memory cells 105 through the various components (e.g., a row decoder 110, a column decoder 120, a sense component 130, among other components). In some examples, one or more of a row decoder 110, a column decoder 120, and a sense component 130 may be co-located with the local memory controller 150. The local memory controller 150 may be operable to receive information (e.g., commands, data) from one or more different controllers (e.g., an external memory controller associated with a host device, another controller associated with the memory device 100), translate the information into a signaling that can be used by the memory device 100, perform one or more operations on the memory cells 105 and communicate data from the memory device 100 to a host device based on performing the one or more operations. The local memory controller 150 may generate row address signals and column address signals to activate access lines such as a target row line 115 and a target column line 125. The local memory controller 150 also may generate and control various signals (e.g., voltages, currents) used during the operation of the memory device 100. In general, the amplitude, the shape, or the duration of an applied signal discussed herein may be varied and may be different for the various operations discussed in operating the memory device 100.

The local memory controller 150 may be operable to perform one or more access operations on one or more memory cells 105 of the memory device 100. Examples of access operations may include a write operation, a read operation, a refresh operation, a precharge operation, or an activate operation, among others. In some examples, access operations may be performed by or otherwise coordinated by the local memory controller 150 in response to access commands (e.g., from a host device). The local memory controller 150 may be operable to perform other access operations not listed here or other operations related to the operating of the memory device 100 that are not directly related to accessing the memory cells 105.

In some examples, the memory device 100 may include pier structures formed in contact with features formed from alternating layers of materials deposited over a substrate, which may provide mechanical support for subsequent processing. For example, a memory device 100 may include alternating layers of a first material and a second material, which may be formed into various cross-sectional patterns. In some examples, the alternating layers may be formed into a pair of interleaved comb structures. Pier structures may be formed in contact with the cross sectional patterns such that, when either the first material or the second material is removed (e.g., in a selective etching operation) to form voids (e.g., along a direction relative to the substrate), the pier structures provide mechanical support of the cross-sectional pattern of the remaining material. By implementing such pier structures, the voids may be formed with improved stability or tolerances, such that formation of features within the voids (e.g., circuit structures such as the row decoder 110 or column decoder 120, access lines such as the row lines 115 or the word lines 125, memory cells such as the memory cell 105) may be performed with reduced variability or otherwise improved consistency. In some examples, the piers may further act as a separator between memory cells 105 or other features of the memory device 100. For example, the piers may extend into at least a portion of the interleaved comb structures, and may accordingly act as barriers during subsequent depositions of materials.

The memory device 100 may include any quantity of non-transitory computer readable media that support dense piers for three-dimensional memory arrays. For example, a local memory controller 150, a row decoder 110, a column decoder 120, a sense component 130, or an input/output component 140, or any combination thereof may include or may access one or more non-transitory computer readable media storing instructions (e.g., firmware) for performing the functions ascribed herein to the memory device 100. For example, such instructions, if executed by the memory device 100, may cause the memory device 100 to perform one or more associated functions as described herein.

Figure 2:
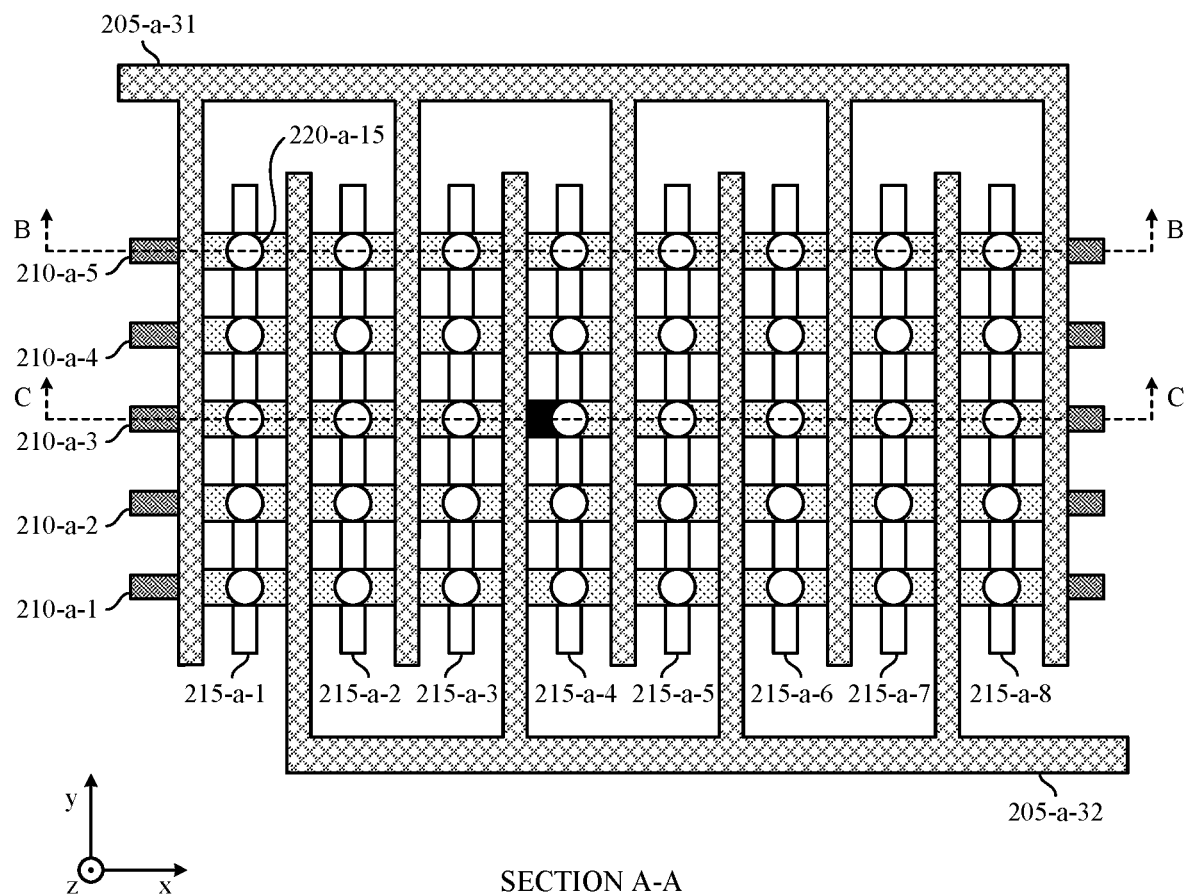
FIG. 2 illustrates a top view of an example of a memory array that supports dense piers for three-dimensional memory arrays in accordance with examples as disclosed herein.
Figure 3A:
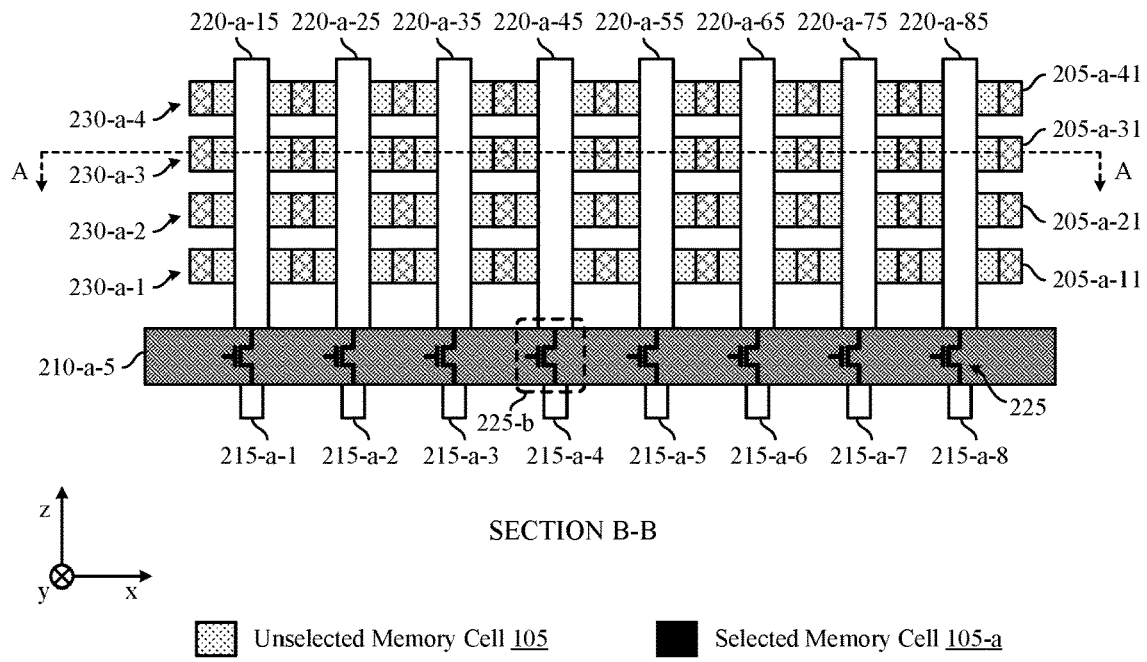
FIGS. 3A and 3B illustrate side views of an example of a memory array that supports dense piers for three-dimensional memory arrays in accordance with examples as disclosed herein.
Figure 3B:
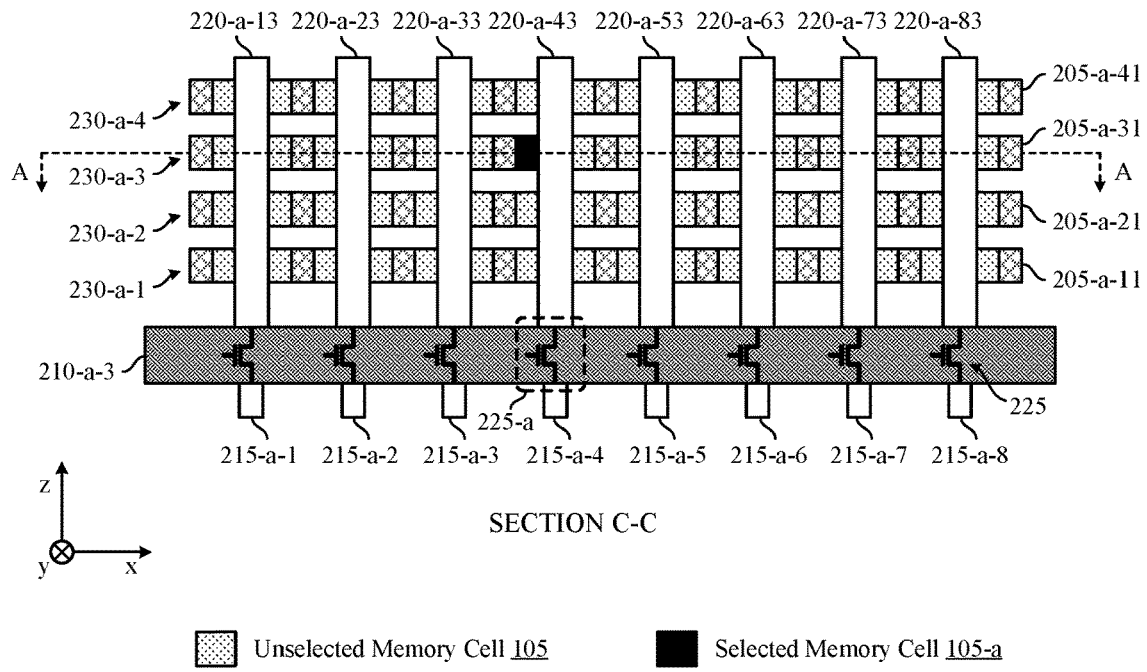

FIGS. 2, 3A, and 3B illustrate an example of a memory array 200 that supports dense piers for three-dimensional memory arrays in accordance with examples as disclosed herein. The memory array 200 may be included in a memory device 100, and illustrates an example of a three-dimensional arrangement of memory cells 105 that may be accessed by various conductive structures (e.g., access lines). FIG. 2 illustrates a top section view (e.g., SECTION A-A) of the memory array 200 relative to a cut plane A-A as shown in FIGS. 3A and 3B. FIG. 3A illustrates a side section view (e.g., SECTION B-B) of the memory array 200 relative to a cut plane B-B as shown in FIG. 2. FIG. 3B illustrates a side section view (e.g., SECTION C-C) of the memory array 200 relative to a cut plane C-C as shown in FIG. 2. The section views may be examples of cross-sectional views of the memory array 200 with some aspects (e.g., dielectric structures) removed for clarity. Elements of the memory array 200 may be described relative to an x-direction, a y-direction, and a z-direction, as illustrated in each of FIGS. 2, 3A, and 3B. Although some elements included in FIGS. 2, 3A, and 3B are labeled with a numeric indicator, other corresponding elements are not labeled, although they are the same or would be understood to be similar, in an effort to increase visibility and clarity of the depicted features. Further, although some quantities of repeated elements are shown in the illustrative example of memory array 200, techniques in accordance with examples as described herein may be applicable to any quantity of such elements, or ratios of quantities between one repeated element and another.

In the example of memory array 200, memory cells 105 and word lines 205 may be distributed along the z-direction according to levels 230 (e.g., decks, layers, planes, as illustrated in FIGS. 3A and 3B). In some examples, the z-direction may be orthogonal to a substrate (not shown) of the memory array 200, which may be below the illustrated structures along the z-direction. Although the illustrative example of memory array 200 includes four levels 230, a memory array 200 in accordance with examples as disclosed herein may include any quantity of one or more levels 230 (e.g., 64 levels, 128 levels) along the z-direction.

Each word line 205 may be an example of a portion of an access line that is formed by one or more conductive materials (e.g., one or more metal portions, one or more metal alloy portions). As illustrated, a word line 205 may be formed in a comb structure, including portions (e.g., projections, tines) extending along the y-direction through gaps (e.g., alternating gaps) between pillars 220. For example, as illustrated, the memory array 200, may include two word lines 205 per level 230 (e.g., according to odd word lines 205-*a*-*n*1 and even word lines 205-*a*-*n*2 for a given level, n), where such word lines 205 of the same level 230 may be described as being interleaved (e.g., with portions of an odd word line 205-*a*-*n*1 projecting along the y-direction between portions of an even word line 205-*a*-*n*2, and vice versa). In some examples, an odd word line 205 (e.g., of a level 230) may be associated with a first memory cell 105 on a first side (e.g., along the x-direction) of a given pillar 220 and an even word line (e.g., of the same level 230) may be associated with a second memory cell 105 on a second side (e.g., along the x-direction, opposite the first memory cell 105) of the given pillar 220. Thus, in some examples, memory cells 105 of a given level 230 may be addressed (e.g., selected, activated) in accordance with an even word line 205 or an odd word line 205.

Each pillar 220 may be an example of a portion of an access line that is formed by one or more conductive materials (e.g., one or more metal portions, one or more metal alloy portions). As illustrated, the pillars 220 may be arranged in a two-dimensional array (e.g., in an xy-plane) having a first quantity of pillars 220 along a first direction (e.g., eight pillars along the x-direction, eight rows of pillars), and having a second quantity of pillars 220 along a second direction (e.g., five pillars along the y-direction, five columns of pillars). Although the illustrative example of memory array 200 includes a two-dimensional arrangement of eight pillars 220 along the x-direction and five pillars 220 along the y-direction, a memory array 200 in accordance with examples as disclosed herein may include any quantity of pillars 220 along the x-direction and any quantity of pillars 220 along the y-direction. Further, as illustrated, each pillar 220 may be coupled with a respective set of memory cells 105 (e.g., along the z-direction, one or more memory cells 105 for each level 230). A pillar 220 may have a cross-sectional area in an xy-plane that extends along the z-direction. Although illustrated with a circular cross-sectional area in the xy-plane, a pillar 220 may be formed with a different shape, such as having an elliptical, square, rectangular, polygonal, or other cross-sectional area in an xy-plane.

The memory cells 105 each may include a chalcogenide material. In some examples, the memory cells 105 may be examples of thresholding memory cells. Each memory cell 105 may be accessed (e.g., addressed, selected) according to an intersection between a word line 205 (e.g., a level selection, which may include an even or odd selection within a level 230) and a pillar 220. For example, as illustrated, a selected memory cell 105-*a* of the level 230-*a*-3 may be accessed according to an intersection between the pillar 220-*a*-43 and the word line 205-*a*-32.

A memory cell 105 may be accessed (e.g., written to, read from) by applying an access bias (e.g., an access voltage, $V_{access}$, which may be a positive voltage or a negative voltage) across the memory cell 105. In some examples, an access bias may be applied by biasing a selected word line 205 with a first voltage (e.g., $V_{access}/2$) and by biasing a selected pillar 220 with a second voltage (e.g., $-V_{access}/2$), which may have an opposite sign relative to the first voltage. Regarding the selected memory cell 105-*a*, a corresponding access bias (e.g., the first voltage) may be applied to the word line 205-*a*-32, while other unselected word lines 205 may be grounded (e.g., biased to 0V). In some examples, a word line bias may be provided by a word line driver (not shown) coupled with one or more of the word lines 205.

To apply a corresponding access bias (e.g., the second voltage) to a pillar 220, the pillars 220 may be configured to be selectively coupled with a sense line 215 (e.g., a digit line, a column line, an access line extending along the y-direction) via a respective transistor 225. In some examples, the transistors 225 may be vertical transistors (e.g., transistors having a channel along the z-direction, transistors having a semiconductor junction along the z-direction), which may be formed above the substrate of the memory array 200 using various techniques (e.g., thin film techniques). In some examples, a selected pillar 220, a selected sense line 215, or a combination thereof may be an example of a selected column line 125 described with reference to FIG. 1 (e.g., a bit line).

The transistors 225 may be activated by gate lines 210 (e.g., activation lines, selection lines, a row line, an access line extending along the x-direction) coupled with respective gates of a set of the transistors 225 (e.g., a set along the x-direction). In other words, each of the pillars 220 may have a first end (e.g., towards the negative z-direction, a bottom end) configured for coupling with an access line (e.g., a sense line 215). In some examples, the gate lines 210, the transistors 225, or both may be considered to be components of a row decoder 110 (e.g., as pillar decoder components). In some examples, the selection of (e.g., biasing of) pillars 220, or sense lines 215, or various combinations thereof, may be supported by a column decoder 120, or a sense component 130, or both.

To apply the corresponding access bias (e.g., $-V_{access}/2$) to the pillar 220-a-43, the sense line 215-a-4 may be biased with the access bias, and the gate line 210-a-3 may be grounded (e.g., biased to 0V) or otherwise biased with an activation voltage. In an example where the transistors 225 are n-type transistors, the gate line 210-a-3 being biased with a voltage that is relatively higher than the sense line 215-a-4 may activate the transistor 225-a (e.g., cause the transistor 225-a to operate in a conducting state), thereby coupling the pillar 220-a-43 with the sense line 215-a-4 and biasing the pillar 220-a-43 with the associated access bias. However, the transistors 225 may include different channel types, or may be operated in accordance with different biasing schemes, to support various access operations.

In some examples, unselected pillars 220 of the memory array 200 may be electrically floating when the transistor 225-a is activated, or may be coupled with another voltage source (e.g., grounded, via a high-resistance path, via a leakage path, along an end of the pillars 220 opposite from the transistors 225) to avoid a voltage drift of the pillars 220. For example, a ground voltage being applied to the gate line 210-a-3 may not activate other transistors coupled with the gate line 210-a-3, because the ground voltage of the gate line 210-a-3 may not be greater than the voltage of the other sense lines 215 (e.g., which may be biased with a ground voltage or may be floating). Further, other unselected gate lines 210, including gate line 210-a-5 as shown in FIG. 3A, may be biased with a voltage equal to or similar to an access bias (e.g., $-V_{read}/2$, or some other negative bias or bias relatively near the access bias voltage), such that transistors 225 along an unselected gate line 210 are not activated. Thus, the transistor 225-b coupled with the gate line 210-a-5 may be deactivated (e.g., operating in a non-conductive state), thereby isolating the voltage of the sense line 215-a-4 from the pillar 220-a-45, among other pillars 220.

In a write operation, a memory cell 105 may be written to by applying a write bias (e.g., where $V_{access}=V_{write}$, which may be a positive voltage or a negative voltage) across the memory cell 105. In some examples, a polarity of a write bias may influence (e.g., determine, set, program) a behavior or characteristic of the material of the memory cell 105, such as the threshold voltage of the material. For example, applying a write bias with a first polarity may set the material of the memory cell 105 with a first threshold voltage, which may be associated with storing a logic 0. Further, applying a write bias with a second polarity (e.g., opposite the first polarity) may set the material of the memory cell with a second threshold voltage, which may be associated with storing a logic 1. A difference between threshold voltages of the material of the memory cell 105 for different logic states stored by the material of the memory cell 105 (e.g., a difference between threshold voltages when the material is storing a logic state '0' versus a logic state '1') may correspond to the read window of the memory cell 105.

In a read operation, a memory cell 105 may be read from by applying a read bias (e.g., where $V_{access}=V_{read}$, which may be a positive voltage or a negative voltage) across the memory cell 105. In some examples, a logic state of the memory cell 105 may be evaluated based on whether the memory cell 105 thresholds in the presence of the applied read bias. For example, such a read bias may cause a memory cell 105 storing a first logic state (e.g., a logic 0) to threshold (e.g., permit a current flow, permit a current above a threshold current), and may not cause a memory cell 105 storing a second logic state (e.g., a logic 1) to threshold (e.g., may not permit a current flow, may permit a current below a threshold current).

In some examples, the memory array 200 may include pier structures formed in contact with features formed from alternating layers of materials deposited over a substrate, which may provide mechanical support for subsequent processing. For example, a memory array 200 may include alternating layers of a first material and a second material, which may be formed into various cross-sectional patterns. In some examples, the alternating layers may be formed into a pair of interleaved comb structures, such as the word lines 205. Pier structures may be formed in contact with the cross sectional patterns such that, when either the first material or the second material is removed (e.g., in a selective etching operation) to form voids (e.g., along a direction relative to the substrate), the pier structures provide mechanical support of the cross-sectional pattern of the remaining material. By implementing such pier structures, the voids may be formed with improved stability or tolerances, such that formation of features within the voids may be performed with reduced variability or otherwise improved consistency. In some examples, the piers may further act as a separator between memory cells 105 or other features of the memory array 200. For example, the piers may extend into at least a portion of the interleaved comb structures, and may accordingly act as barriers during subsequent depositions of materials.

Figure 4A:
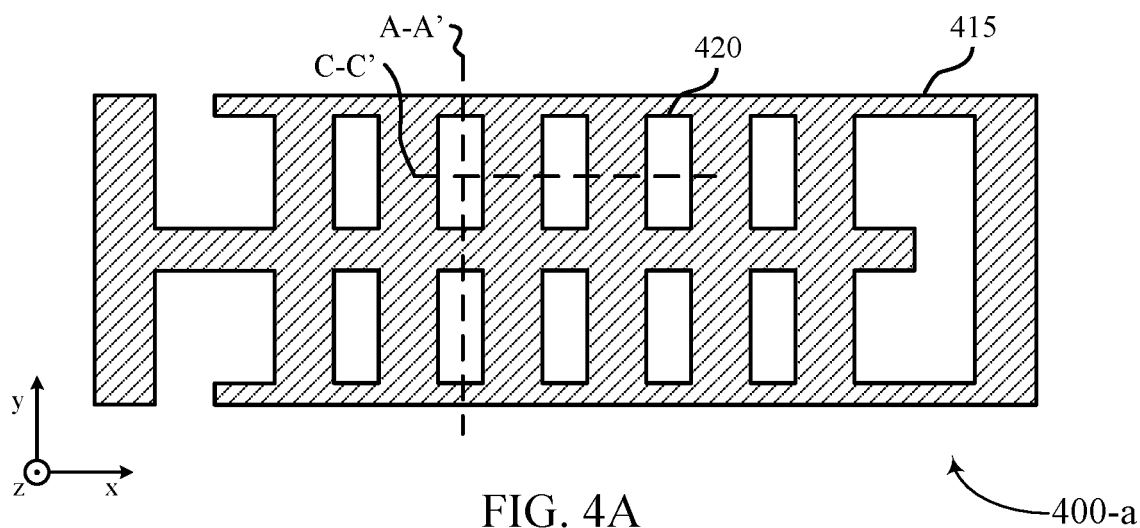
FIGS. 4A, 4B, and 4C illustrate examples of a step of a manufacturing process of a memory array that supports dense piers for three-dimensional memory arrays in accordance with examples as disclosed herein.
Figure 4B:
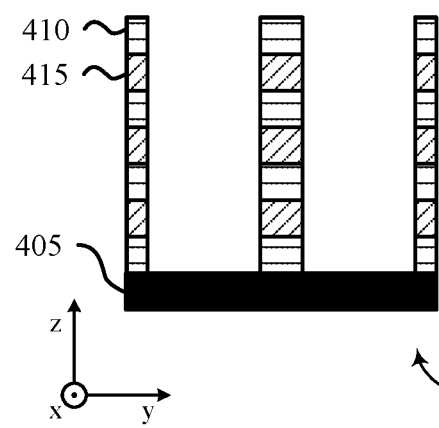
Figure 4C:
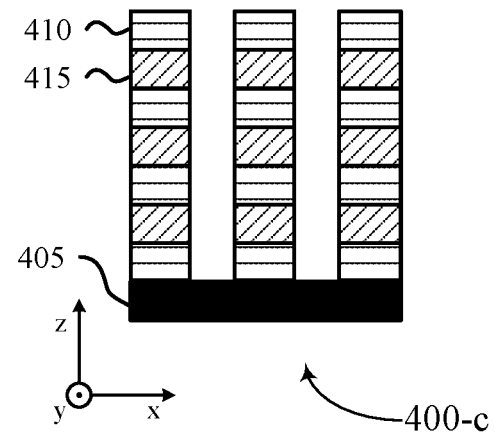

FIGS. 4A, 4B, and 4C illustrate examples of a step of a manufacturing process of a memory array that supports dense piers for three-dimensional memory arrays in accordance with examples as disclosed herein.

FIG. 4A illustrates a top-down view of a step of the manufacturing process of a memory array 400-a. In some cases, the memory array 400-a may include an alternating stack of materials formed over a substrate 405. For example, the memory array 400-a may include one or more layers or tiers of a first material 410 and one or more layers or tiers of a second material 415. The manufacturing process may include forming the stack of materials, for example by depositing each layer of the stack of layers. In some examples, the first material 410 may be a dielectric material, such as an oxide material. Additionally, the second material 415 may be an example of another dielectric material, such as a nitride material.

In some cases, the manufacturing process may further include forming a set of cavities 420 through the stack of materials. For example, the set of cavities 420 may be formed by performing a vertical etch through the stack of materials using a first etching mask. In some cases, the etching may terminate above the substrate 405. That is, the substrate 405 may not be etched during the etching process.

FIG. 4B illustrates a cross-sectional view a step of the manufacturing process of a memory array 400-$b$ along section line A-A', while FIG. 4C illustrates a cross-sectional view a step of the manufacturing process of a memory array 400-$c$ along section line C-C'. FIG. 4A may illustrate the top-down view sectioned through one of the layers of the second material 415.

FIGS. 5A, 5B, and 5C illustrate examples of a step of the manufacturing process of a memory array that supports dense piers for three-dimensional memory arrays in accordance with examples as disclosed herein.

FIG. 5A illustrates a top-down view of a step of the manufacturing process of a memory array 500-$a$. In some examples, the step of the manufacturing process of the memory array 500-$a$ may include forming a set of piers 505. A pier 505 may be an example of a support structure, such as a pillar or column of dielectric material which adheres to or supports the stack of materials. In some examples, a pier 505 may provide mechanical support to the stack of material during subsequent steps of the manufacturing process. For example, a pier 505 may limit movement of the stack of materials in the x-direction, the y-direction, the z-direction, or any combination thereof.

For example, the manufacturing process may include depositing a pier material, such as a dielectric material, into each of the set of cavities 420. The dielectric material may fill the set of cavities 420, and may contact each of the layers (e.g., each layer of the first material 410 and each layer of the second material 415). Additionally or alternatively, a pier 505 may include a dielectric liner material, such as an oxide or a nitride (e.g., the first material 410 or the second material 415), and a filler material, such as an aluminum oxide (AlOx), an oxide, or polysilicon. Accordingly, the set of piers 505 may provide mechanical support for the stack of materials during subsequent steps of the manufacturing process. In some examples, the dielectric material of the piers 505 may be the same as the dielectric material of the first material 410. Alternatively, the piers 505 and the first material 410 may be examples of different materials or combinations of materials. For example, the piers 505 may include an oxide liner.

In some examples, forming the set of piers 505 may include a polishing step. For instance, after depositing the pier material, the stack of materials may be polished or planarized, for example using a chemical mechanical polishing (CMP) procedure.

FIG. 5B illustrates a cross-sectional view a step of the manufacturing process of a memory array 500-$b$ along section line A-A', while FIG. 5C illustrates a cross-sectional view a step of the manufacturing process of a memory array 500-$c$ along section line C-C'. FIG. 5A may illustrate the top-down view sectioned through one of the layers of the second material 415.

FIGS. 6A, 6B, 6C, and 6D illustrate examples of a step of the manufacturing process of a memory array that supports dense piers for three-dimensional memory arrays in accordance with examples as disclosed herein.

FIG. 6A illustrates a top-down view of a step of the manufacturing process of a memory array 600-$a$. In some cases, the memory array 600-$a$ may include a set of cavities 605. The set of cavities 605 may be formed by etching (e.g., via a second vertical etch using a second mask) or removing material from the stack of materials (e.g., the first material 410 and the second material 415). In some cases, forming the set of cavities 605 may expose at least a portion of sidewalls of the piers 505, as well exposing portions of the stack of materials (e.g., as illustrated in FIG. 6C). Additionally, forming the set of cavities 605 may expose portions of the substrate 405. In some examples, the etching process to form the set of cavities 605 may be selective to the material of the set of piers 505. That is, the etching process may selectively remove material, such as the first material 410 and the second material 410, while preserving the material of the set of piers 505 (e.g., the second dielectric material). Accordingly, the pattern used to etch the set of cavities 605 may include a stripe, which may cover at least a portion of the set of piers 505. Alternatively, the pattern used to etch the set of cavities 605 may etching a set of isolated holes (e.g., corresponding to the location of each cavity 605 of the set of cavities 605). In such cases, the etching process may be directional (e.g., etching along the z direction).

In some cases, a length 610 in the y-direction of each cavity 605 of the set of cavities 605 may be less than a length 615 in the y-direction of each pier 505 of the set of piers 505. For example, each pier 505 may extend past respective adjacent cavities 605, which may provide increased mechanical support (e.g., relative to a pier having a same length as a corresponding cavity), for example by more effectively truncating a memory cell formed in a cavity 605 (e.g., around a bit line pillar in the cavity 605). Accordingly, memory cells formed in a cavity 605 and in contact with a pier 505 may be less likely to experience manufacturing defects, which may increase the final density of a manufactured memory array.

Forming the set of cavities 605 may define a set of interleaved comb structures, such as a first comb structure 620-$a$ and a second comb structure 620-$b$. In some cases, each comb structure of the set of interleaved comb structure may include a set of "teeth" or tines extending horizontally (e.g., in the x-direction) from a base. The tines of the first comb structure 620-$a$ may alternate (e.g., in the y-direction) with the tines of the second comb structure 620-$b$. The set of interleaved comb structures may correspond to one or more word line plates (e.g., the first comb structure 620-$a$ may include a set of first word lines, and the second comb structure 620-$b$ may include a set of second word lines), as described in greater detail with reference to FIGS. 8A, 8B, and 8C. In some examples, forming the set of interleaved comb structures using two etching steps (e.g., the etching of the piers 505 and the etching of the cavities 605) may reduce complexity of the manufacturing process relative to other manufacturing process which may use a greater quantity of etching steps to form a set of interleaved comb structures.

FIG. 6B illustrates a cross-sectional view a step of the manufacturing process of a memory array 600-$b$ along section line A-A', FIG. 6C illustrates a cross-sectional view a step of the manufacturing process of a memory array 600-$b$ along section line B-B', and FIG. 6D illustrates a cross-sectional view a step of the manufacturing process of a memory array 600-$c$ along section line C-C'. FIG. 6A may illustrate the top-down view sectioned through one of the layers of the second material 415.

Figure 7A:
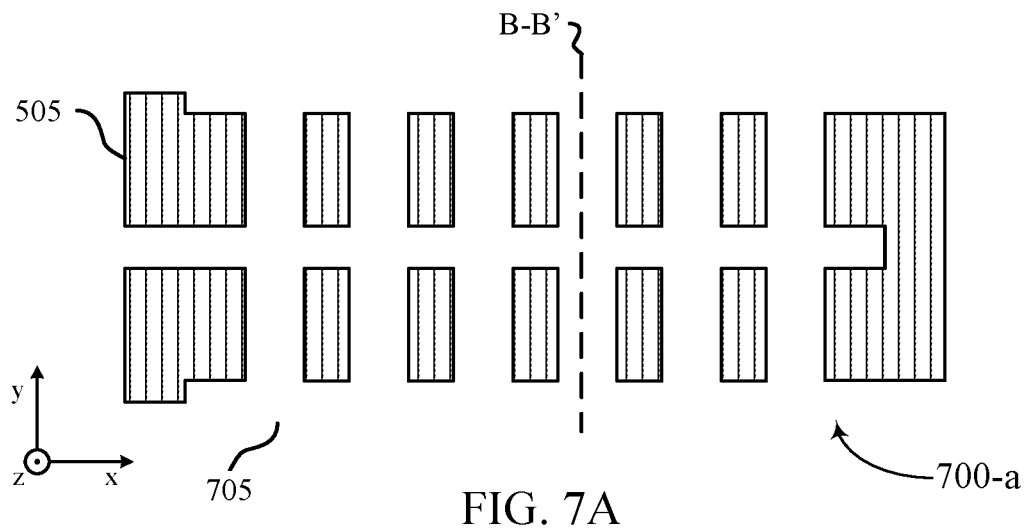
FIGS. 7A, 7B, and 7C illustrate examples of a step of a manufacturing process of a memory array that supports dense piers for three-dimensional memory arrays in accordance with examples as disclosed herein.
Figure 7B:
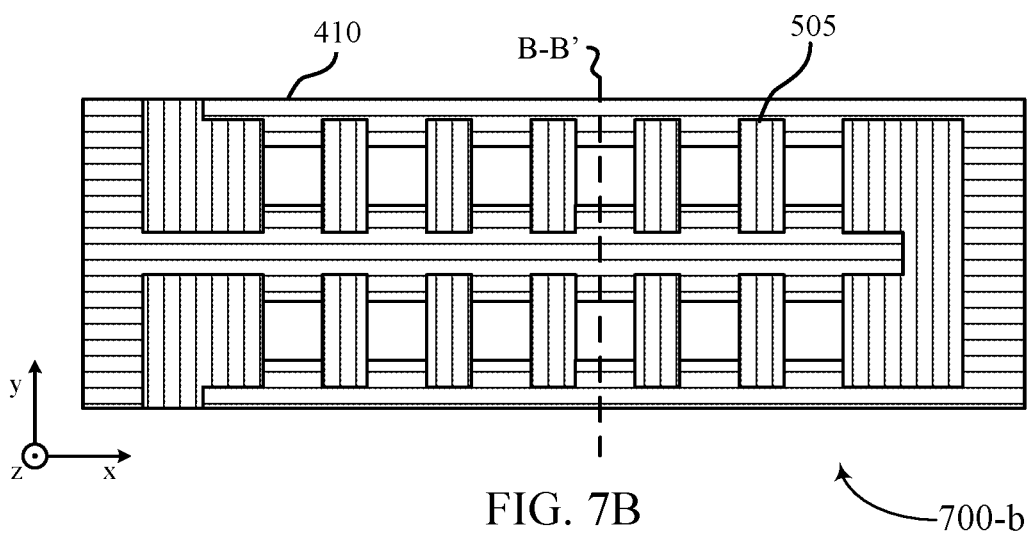
Figure 7C:
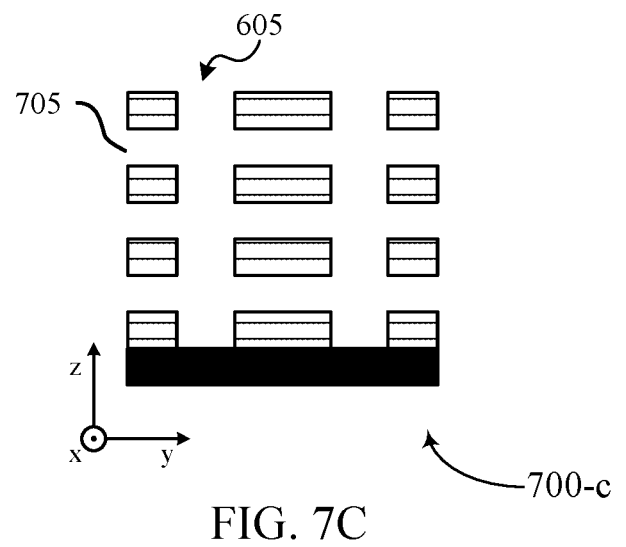

FIGS. 7A, 7B, and 7C illustrate examples of a step of the manufacturing process of a memory array that supports dense piers for three-dimensional memory arrays in accordance with examples as disclosed herein.

FIGS. 7A and 7B illustrates a top-down views of a step of the manufacturing process of a memory array 700-*a*. FIG. 7A illustrates a view of the memory array 700-*a* at a first level corresponding to the second material 415, while FIG. 7B illustrates a view of the memory array 700-*b* at a second level corresponding to the first material 410. Additionally, FIG. 7C illustrates a cross-sectional view a step of the manufacturing process of a memory array 700-*c* along section line B-B'.

In some cases, the manufacturing process may include removing or exhuming the second material 415 (e.g., the nitride material). For example, the second material 415 may be removed using an etching procedure (e.g., an omnidirectional etch, a horizontal etch). In some cases, the process to remove the second material 415 may be selective to the second material 415. That is, other materials of the memory array 700-*a*, such as the first material 410, the substrate 405, the piers 505, or any combination thereof may remain. In some cases, removing the second material 415 may leave a set of voids 705. The set of voids 705 may separate the layers of the first material 410, which may induce stress on the tines of the set of interleaved comb structures.

Accordingly, after the second material 415 has been removed, the set of piers 505 may provide mechanical support for the tines of the set of interleaved comb structures. For example, the set of piers 505 may remain in contact with the layers of the first material 410, and may prevent or reduce movement of the tines of the set of comb structures during this and subsequent steps of the manufacturing process.

Figure 8A:
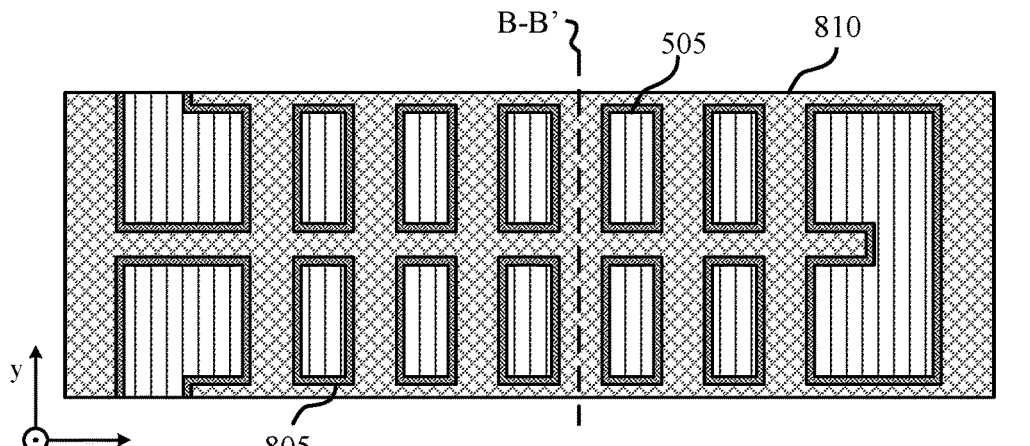
FIGS. 8A, 8B and 8C illustrate examples of a step of a manufacturing process of a memory array that supports dense piers for three-dimensional memory arrays in accordance with examples as disclosed herein.
Figure 8B:
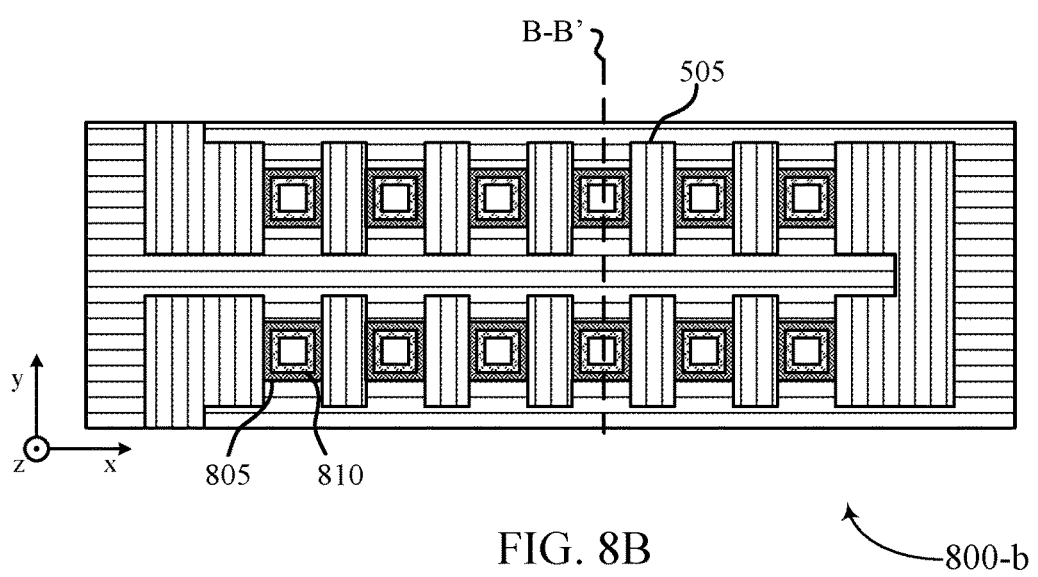
Figure 8C:
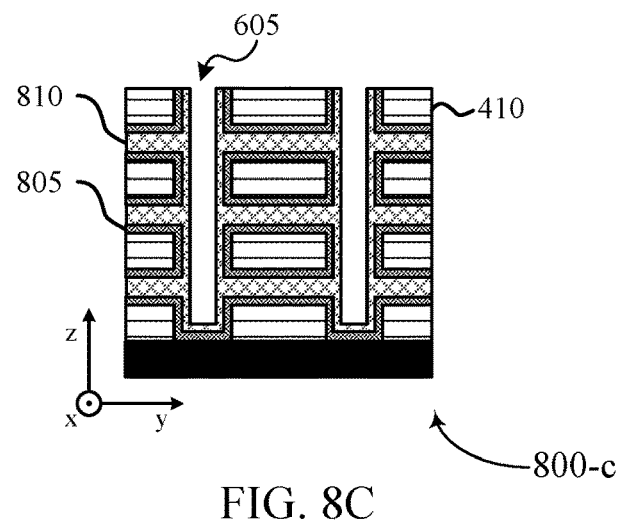

FIGS. 8A, 8B, and 8C illustrate examples of a step of the manufacturing process of a memory array that supports dense piers for three-dimensional memory arrays in accordance with examples as disclosed herein.

FIG. 8A illustrates a top-down view of a step of the manufacturing process of a memory array 800-*a*. In some cases, the manufacturing process may include forming a set of word lines or word line plates in the memory array 800-*a*. For example, the manufacturing process may include depositing one or more materials in the set of voids 705.

In some examples, an interface material, such as a barrier material 805, may be deposited into the set of voids 705. The barrier material 805 may coat or cover portions of the tines of the interleaving comb structure, as illustrated in FIG. 8C. For example, the barrier material 805 may be deposited to be in contact with the layers of the first material of the first comb structure 620-*a* and the second comb structure 620-*b*. In some cases, the barrier material 805 may be deposited in contact with at a portion of the exposed portions of the set of piers 505.

Subsequently, a conductive material 810 may be deposited in the set of voids 705. The conductive material 810 may be an example of metallic material, such as tungsten (W), and may form the conductive portion of a word line plate. In some case, the conductive material 810 may be deposited in contact with the barrier material 805, and may fill the remaining portions of the set of voids 705. The barrier material 805 may be a conductive material, and may be a ceramic material or ceramic metal. Examples of materials for barrier material 805 include titanium nitride (TiN), titanium silicon nitride (TiSiN), tungsten nitride (WN), tungsten silicon nitride (WSiN), or other materials. The barrier material 805 may act as a barrier between the conductive material 810 and the dielectric materials, such as the first material 410 and the piers 505. The barrier material 805 and the conductive material 810 may be deposited to fill most or all of the set of voids 705. In some cases, the barrier material 805 and the conductive material 810 may fill at least a portion of each cavity of the set of cavities 605.

FIG. 8B illustrates a top-down view of a step of the manufacturing process of a memory array 800-*b*, while FIG. 8C illustrates a cross-sectional view a step of the manufacturing process of a memory array 800-*c* along section line B-B'. The top-down view shown in FIG. 8A may correspond to a section of the stack of layers within one of the prior voids 705, while the top-down view shown in FIG. 8B may correspond to a section of the stack of layers within one of the layers of the first material 410.

Figure 9A:
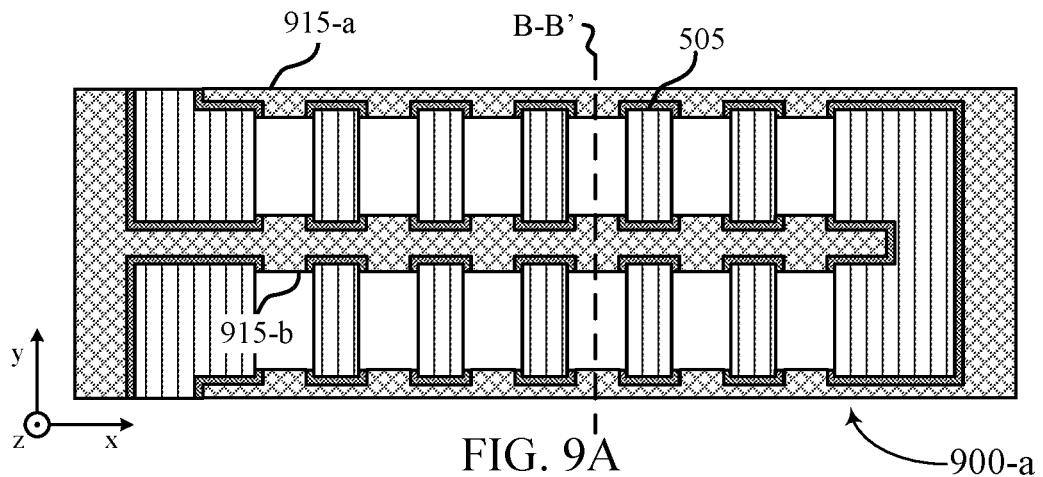
FIGS. 9A, 9B, and 9C illustrate examples of a step of a manufacturing process of a memory array that supports dense piers for three-dimensional memory arrays in accordance with examples as disclosed herein.
Figure 9B:
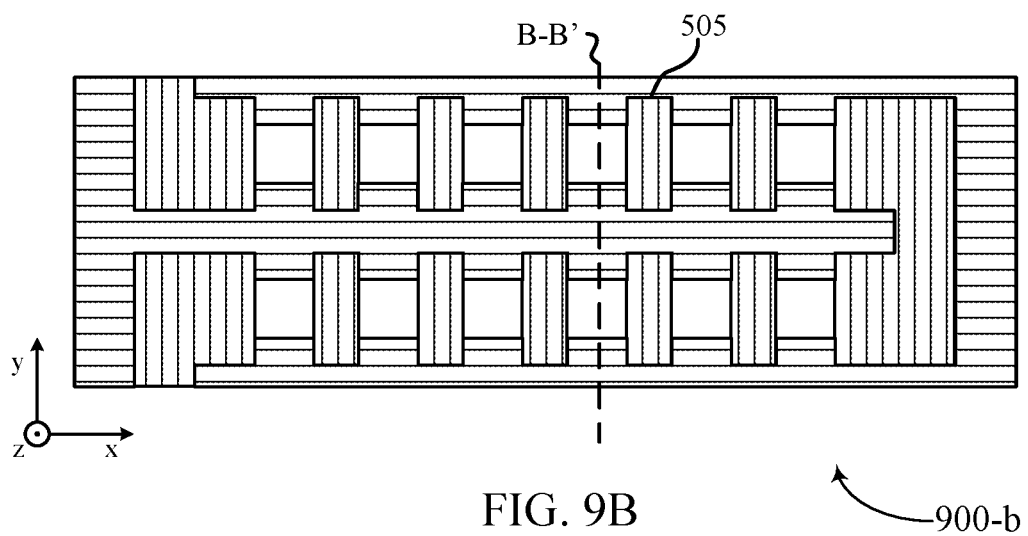
Figure 9C:
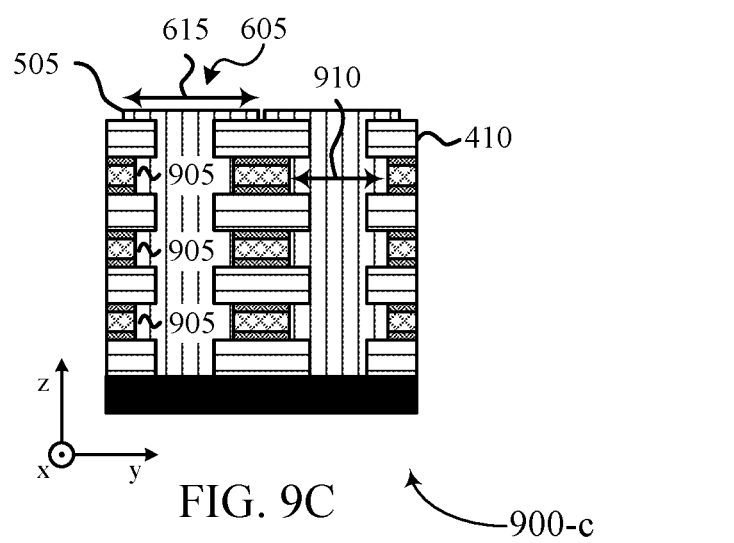

FIGS. 9A, 9B, and 9C illustrate examples of a step of the manufacturing process of a memory array that supports dense piers for three-dimensional memory arrays in accordance with examples as disclosed herein.

FIG. 9A illustrates a top-down view of a step of the manufacturing process of a memory array 900-*a*. The memory array 900-*a* may illustrate a view at the first level (e.g., as described with reference to FIGS. 7A and 7B). In some cases, the step of the manufacturing process of the memory array 900-*a* may be performed subsequent to the step of the manufacturing process of the memory array 800-*a* as described with reference to FIG. 8A. In some cases, during the step of the manufacturing process of the memory array 900-*a*, at least a portion of the deposited word line materials (e.g., the barrier material 805, the conductive material 810) may be removed, for example by etching or recessing. In some examples, the recessing may recess the barrier material 805 and the conductive material 810 into the set of interleaved comb structures (e.g., as described with reference to FIG. 6A). Accordingly, the recessing may form a set of word lines or word line plates, such as a first word line 915-*a* (e.g., an even word line) and a second word line 915-*c* (e.g., an odd word line).

FIG. 9B illustrates a top-down view of a step of the manufacturing process of a memory array 900-*b*. The memory array 900-*b* may illustrate a view at the second level (e.g., as described with reference to FIGS. 7A and 7B). In some examples, the recessing may expose at least portions of the layers of the first material 410. For example, the recessing may remove the barrier material 805 and the conductive material 810 from the set of cavities 605.

FIG. 9C illustrates a cross-sectional view a step of the manufacturing process of a memory array 900-*c* along section line B-B'. As illustrated in FIG. 9C, the recessing may form a set of cavities or recesses 905 between the layers of the first material 410. In some examples, the depths of the recesses 905 (e.g., in the y-direction) may be such that the piers 505 (extended above the first material 410 for clarity) extend beyond the recesses 905. That is, the length 615 of a pier in the y-direction may be greater than a separation 910 between recesses 905 on alternate word lines. Accordingly, a memory cell in a recess 905 may experience greater mechanical stability, which may increase the likelihood of correctly forming a memory cell and thus may increase the final density of a memory array.

Figure 10A:
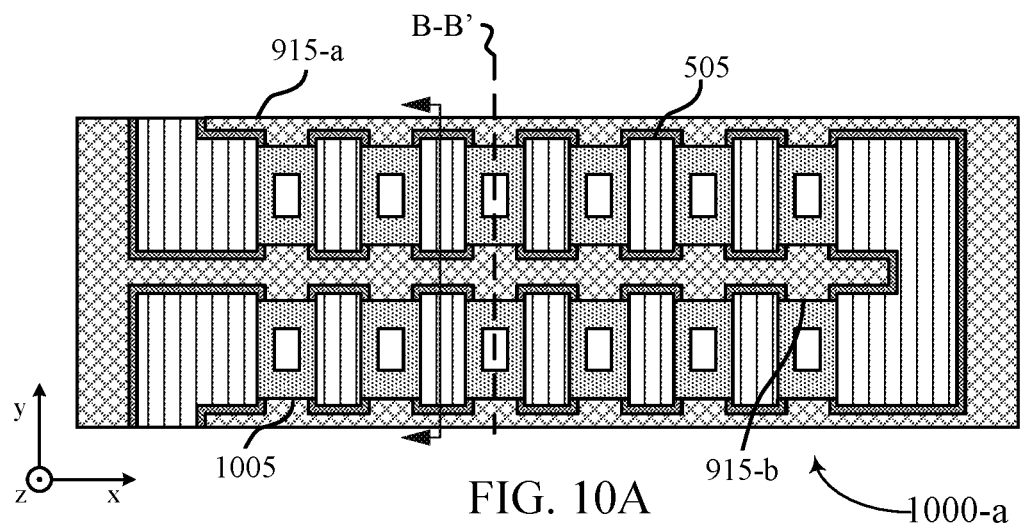
FIGS. 10A and 10B illustrate examples of a step of a manufacturing process of a memory array that supports dense piers for three-dimensional memory arrays in accordance with examples as disclosed herein.
Figure 10B:
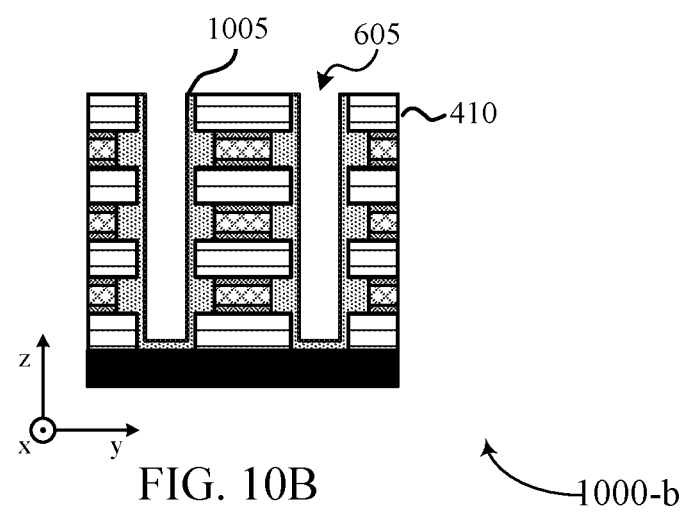

FIGS. 10A and 10B illustrate examples of a step of the manufacturing process of a memory array that supports dense piers for three-dimensional memory arrays in accordance with examples as disclosed herein.

FIG. 10A illustrates a top-down view of a step of the manufacturing process of a memory array 1000-*a*. The memory array 1000-*a* may illustrate a view at the first level (e.g., as described with reference to FIGS. 7A and 7B). In some cases, the step of the manufacturing process of the memory array 1000-a may be performed subsequent to the step of the manufacturing process of the memory array 900-a as described with reference to FIG. 9A.

The step of the manufacturing process of the memory array 1000-a may be part of forming a memory cell at least partially in the recesses 905. In some cases, the memory cell may include an electrode material 1005 may be deposited in each cavity 605. The electrode material 1005 may be an example of a conductive material, and may allow for the flow of current between a storage component of the memory cell (described in greater detail with reference to FIG. 17A) and the word line (e.g., the word line 915-a or the word line 915-b). In some examples, the electrode material 1005 may be in contact both of the interleaving comb structures. Accordingly, after being deposited, the electrode material 1005 may be in contact with both the first word line 915-a and the second word line 915-b.

In some examples, the piers 505 may act as separators for the cavities 605. For example, because the piers 505 extend beyond the cavities (e.g., in the y-direction), the piers 505 may act as a barrier for the electrode material 1005, such that the electrode material 1005 deposited in each cavity 605 are separated by respective piers 505.

FIG. 10B illustrates a cross-sectional view a step of the manufacturing process of a memory array 1000-b along section line B-B'. In some cases, as illustrates in FIG. 10B, the electrode material 1005 may fill the recesses 905, and may cover the exposed substrate 405 in each cavity 605.

Figure 11A:
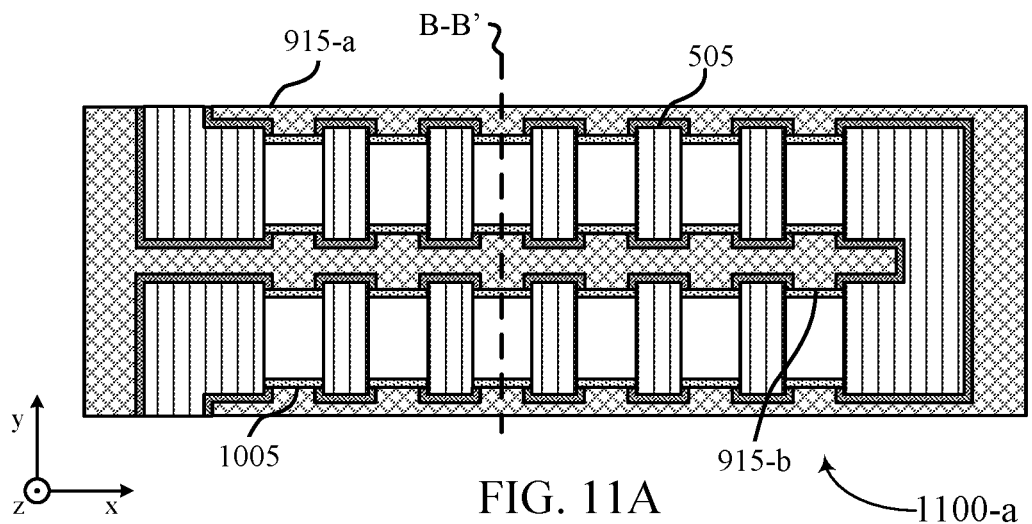
FIGS. 11A and 11B illustrate examples of a step of a manufacturing process of a memory array that supports dense piers for three-dimensional memory arrays in accordance with examples as disclosed herein.
Figure 11B:
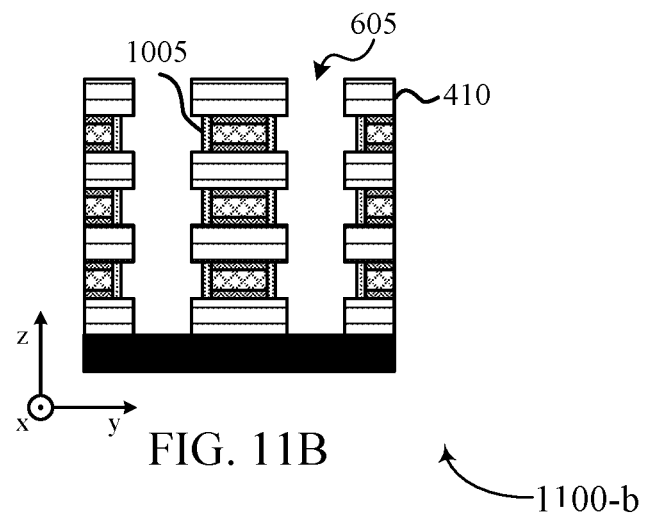

FIGS. 11A and 11B illustrate examples of a step of the manufacturing process of a memory array that supports dense piers for three-dimensional memory arrays in accordance with examples as disclosed herein.

FIG. 11A illustrates a top-down view of a step of the manufacturing process of a memory array 1100-a. In some cases, the step of the manufacturing process of the memory array 1100-a may be performed subsequent to the step of the manufacturing process of the memory array 1000-a as described with reference to FIG. 9A. FIG. 11B illustrates a cross-sectional view a step of the manufacturing process of a memory array 1100-b along section line B-B'.

In some cases, the manufacturing process may include a recess or etch of the electrode material 1005. For example, the electrode material 1005 may be recessed to cover a side wall of the word line plate in each recess 905. leaving a side wall of the first material 410 of each layer exposed to the cavity 605.

Figure 12A:
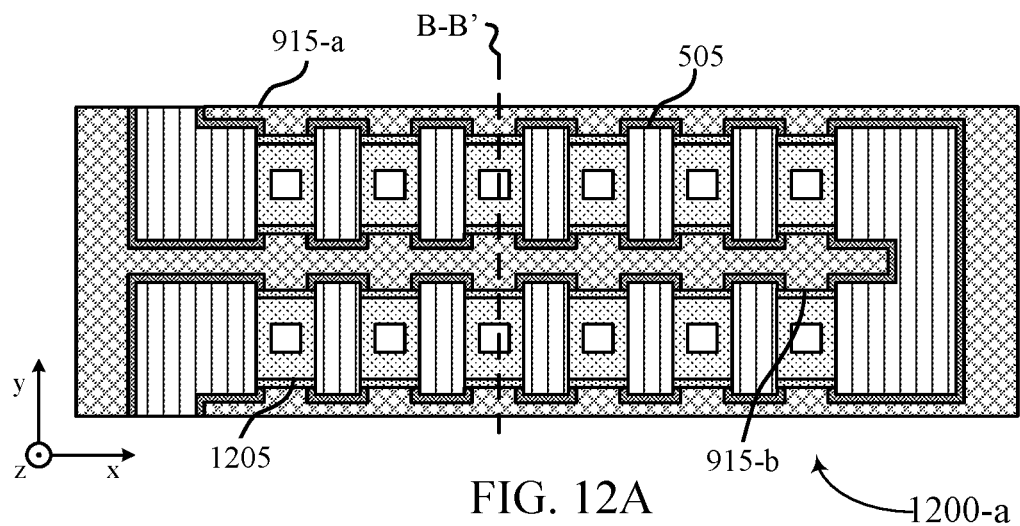
FIGS. 12A and 12B illustrate examples of a step of a manufacturing process of a memory array that supports dense piers for three-dimensional memory arrays in accordance with examples as disclosed herein.
Figure 12B:
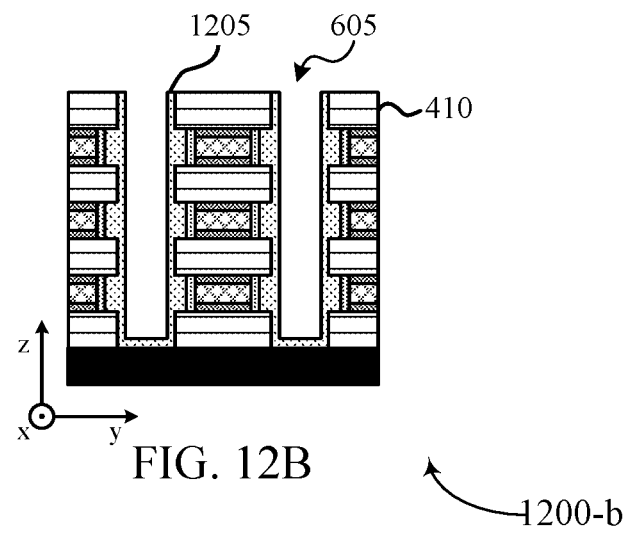

FIGS. 12A and 12B illustrate examples of a step of the manufacturing process of a memory array that supports dense piers for three-dimensional memory arrays in accordance with examples as disclosed herein. The memory array 1200-a may illustrate a view at the first level (e.g., as described with reference to FIGS. 7A and 7B). In some cases, the step of the manufacturing process of the memory array 1200-a may be performed subsequent to the step of the manufacturing process of the memory array 1100-a as described with reference to FIG. 11A.

The step of the manufacturing process of the memory array 1200-a may include depositing a placeholder or sacrificial material 1205 in the set of cavities 605. In some cases, the sacrificial material 1205 may provide support prior to depositing a storage material, or may hold a place for the storage material for steps of the manufacturing process occurring prior to depositing the storage material. In such cases, at least a portion of the sacrificial material 1205 may be removed in a subsequent step of the manufacturing process, as described in greater detail with reference to FIG. 16. In some examples, the sacrificial material 1205 may be in contact both of the interleaving comb structures. Accordingly, after being deposited, the sacrificial material 1205 may be in contact with the electrode material 1005 for both the first word line 915-a and the second word line 915-b.

In some examples, the piers 505 may act as separators for the cavities 605. For example, because the piers 505 extend beyond the cavities (e.g., in the y-direction), the piers 505 may act as a barrier for the sacrificial material 1205, such that the sacrificial materials 1205 deposited in each cavity 605 are separated by respective piers 505.

FIG. 12B illustrates a cross-sectional view a step of the manufacturing process of a memory array 1200-b along section line B-B'. In some cases, as illustrates in FIG. 12B, the sacrificial material 1205 may fill the recesses 905, and may cover the exposed substrate 405 in each cavity 605.

Figure 13A:
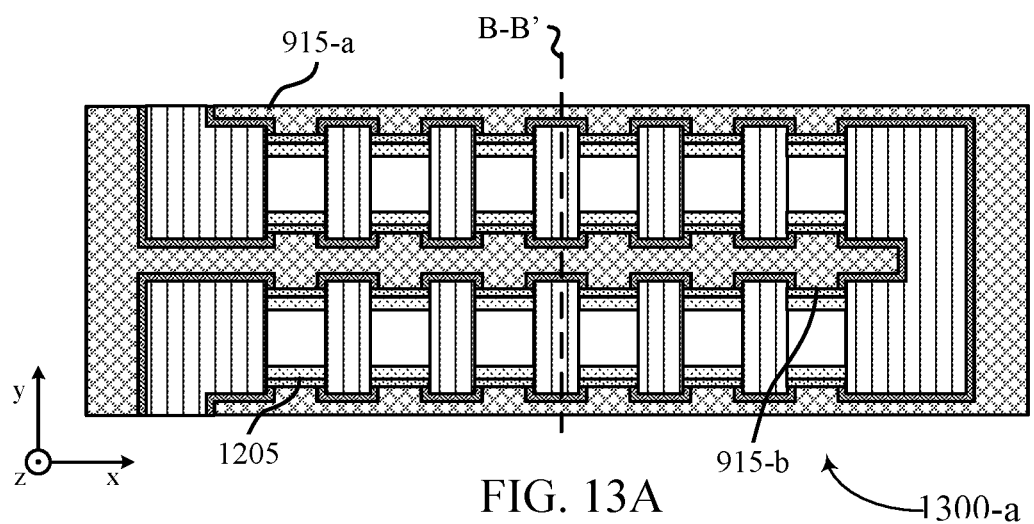
FIGS. 13A and 13B illustrate examples of a step of a manufacturing process of a memory array that supports dense piers for three-dimensional memory arrays in accordance with examples as disclosed herein.
Figure 13B:
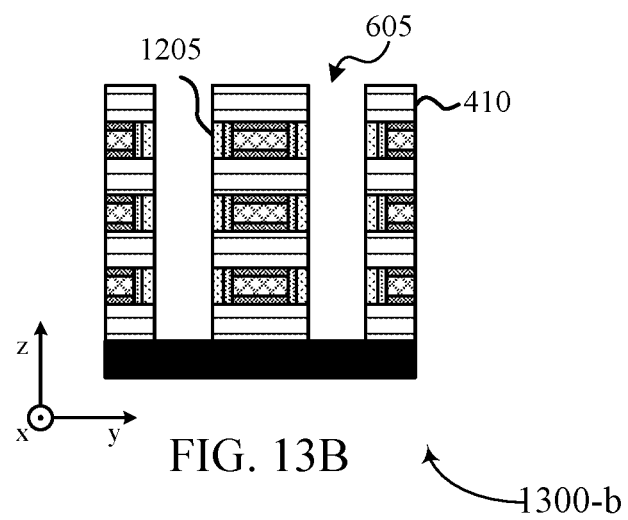

FIGS. 13A and 13B illustrate examples of a step of the manufacturing process of a memory array that supports dense piers for three-dimensional memory arrays in accordance with examples as disclosed herein.

FIG. 13A illustrates a top-down view of a step of the manufacturing process of a memory array 1300-a. In some cases, the step of the manufacturing process of the memory array 1300-a may be performed subsequent to the step of the manufacturing process of the memory array 1200-a as described with reference to FIG. 12A. FIG. 13B illustrates a cross-sectional view a step of the manufacturing process of a memory array 1200-b along section line B-B'.

In some cases, the manufacturing process may include a recess or etch of the sacrificial material 1205. For example, the sacrificial material 1205 may be recessed to cover a side wall of the word line plate in each recess 905. leaving a side wall of the first material 410 of each layer exposed to the cavity 605.

FIGS. 14A, 14B, 14C, and 14D illustrate examples of a step of the manufacturing process of a memory array that supports dense piers for three-dimensional memory arrays in accordance with examples as disclosed herein.

FIG. 14A illustrates a top-down view of a step of the manufacturing process of a memory array 1400-a. In some cases, the memory array 1400-a may illustrate a manufacturing step in which a set of pillars 1405 are formed. The set of pillars may include an electrode material 1410, a barrier material 1415, and a conductive material 1420. In some cases, the electrode material 1410 may be the same material as the electrode material 1005, the barrier material 1415 may be the same material as the barrier material 805, and the conductive material 1420 may be the same material as the conductive material 810. The set of pillars 1405 may be coupled with bit lines (e.g., via selection transistors in substrate 405), and accordingly may be used to access a memory cells of the memory array 1400-a. In some cases, the quantity of pillars 1405 may be equal or substantially equal to the quantity of piers 505. That is, there may be approximately one pier 505 per pillar 1405, which may correspond to a dense pier aspect ratio.

In some cases, the set of pillars 1405 may be formed using one or more steps, as illustrated in FIGS. 14B, 14C, and 14D. For example, FIG. 14B illustrates a cross-sectional view a step of the manufacturing process of a memory array 1400-b along section line B-B'. The manufacturing process may include depositing the electrode material 1410 into each of the set of cavities 605. In some cases, the electrode material 1410 may be deposited in contact with each layer of the first material 410 and the sacrificial material 1205 of each recess 905. Additionally, the electrode material 1410 may be deposited in contact with the substrate 405.

FIG. 14C illustrates a cross-sectional view a step of the manufacturing process of a memory array 1400-c along section line B-B'. The manufacturing process may include etching or removing a portion of the electrode material 1410 in each cavity 605. For example, the electrode material 1410 may be etched to expose the substrate 405 in each cavity 605.

FIG. 14D illustrates a cross-sectional view a step of the manufacturing process of a memory array 1400-d along section line B-B'. The manufacturing process may include depositing one or more materials in the each of the set of cavities 605. For example, manufacturing process may include depositing the barrier material 1415. In some cases, the barrier material 1415 may be deposited in contact with the electrode material 1410 on the side walls of the cavity 605. Additionally, the barrier material 1415 may be depositing in contact with the substrate 405.

The manufacturing process may further include depositing the conductive material 1420. For example, the conductive material 1420 may be depositing in contact with the barrier material 1415, and may fill the remaining portion of the cavity 605. In some cases, forming the set of pillars 1405 may further include performing a planarization process, for example, using a CMP procedure, to smooth or polish the top of the memory array 1400-a.

Figure 15:
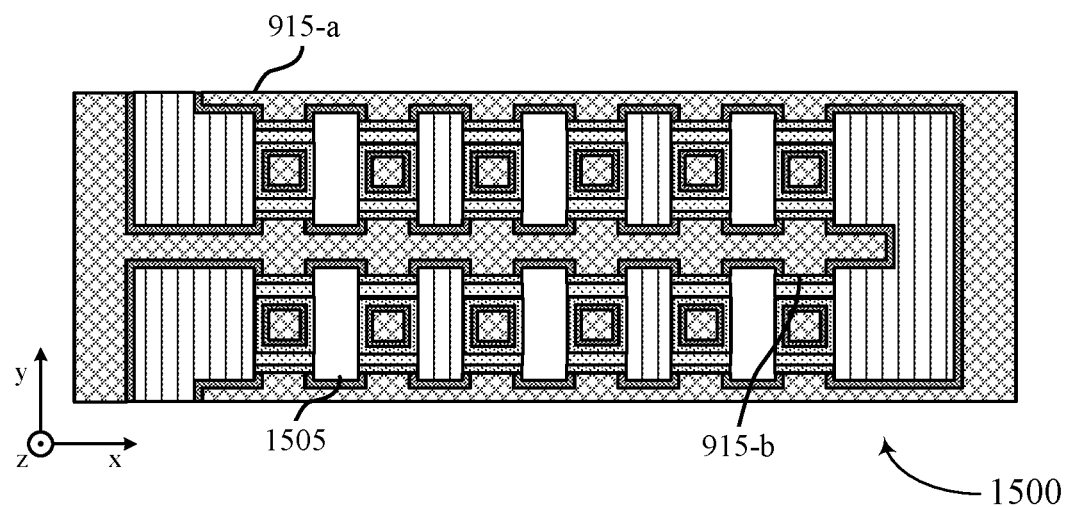
FIG. 15 illustrates an example of a step of a manufacturing process of a memory array that supports dense piers for three-dimensional memory arrays in accordance with examples as disclosed herein.

FIG. 15 illustrates an example of a top-down view of a step of a manufacturing process of a memory array 1500 that supports dense piers for three-dimensional memory arrays in accordance with examples as disclosed herein. In some cases, the step of the manufacturing process of the memory array 1500 may be performed subsequent to the step of the manufacturing process of the memory array 1400-d as described with reference to FIG. 14D.

The step of the manufacturing process of the memory array 1500 may include forming a set of cavities 1505. For example, one or more of the piers 505 may be removed to form the set of cavities 1505, for instance using a vertical etch. In some cases, removing the one or more piers 505 may expose at least one side wall of each pillar 1405, as well as at least one side wall of the electrode material 1005 and the sacrificial material 1205.

Although the example illustrated in FIG. 15 shows every other pier 505 being removed, other quantities are contemplated. For example, each pier 505 may be removed to form the set of cavities 1505. In some examples, an intermediate quantity of piers 505 may be removed (e.g., a quantity between every other pier 505 and each pier 505). In some examples, removing at least every other pier may allow for memory cell formation, as described in greater detail with reference to FIGS. 16 through 19.

Figure 16:
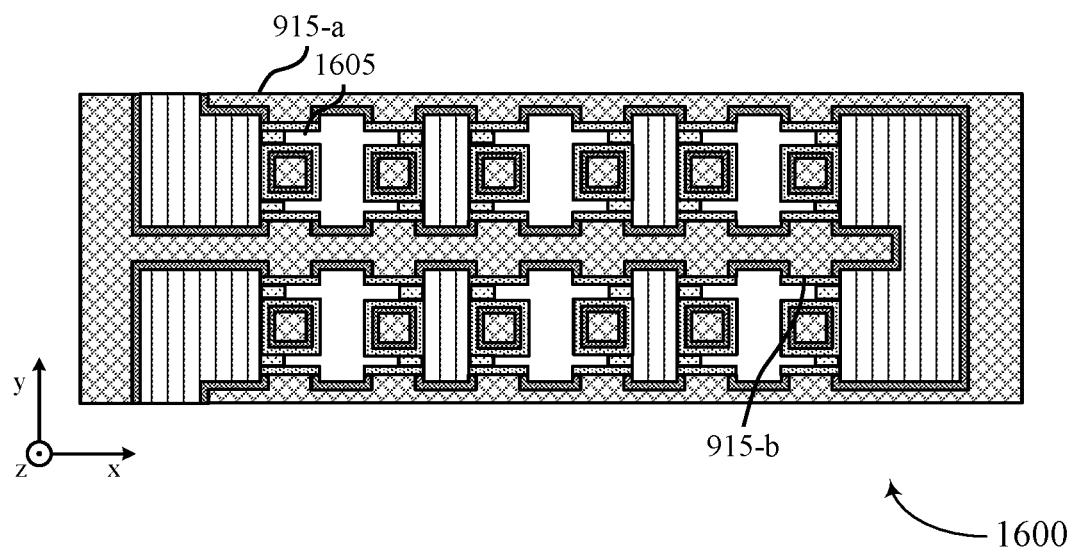
FIG. 16 illustrates an example of a step of a manufacturing process of a memory array that supports dense piers for three-dimensional memory arrays in accordance with examples as disclosed herein.

FIG. 16 illustrates an example of a top-down view of a step of a manufacturing process of a memory array 1600 that supports dense piers for three-dimensional memory arrays in accordance with examples as disclosed herein. In some cases, the manufacturing process may include removing or etching at least a portion of the sacrificial material 1205. For example, the manufacturing process may include a lateral recess operation to remove at least a portion of the sacrificial material 1205 exposed in each cavity 1505. In some cases, removing the portion of the sacrificial material 1205 may form a set of recesses 1605 in each cavity 1505. In some cases, because at least a portion of the sacrificial material 1205 is in contact with a pier 505, each pier 505 may support a respective sacrificial material 1205 during the lateral recess.

Figure 17A:
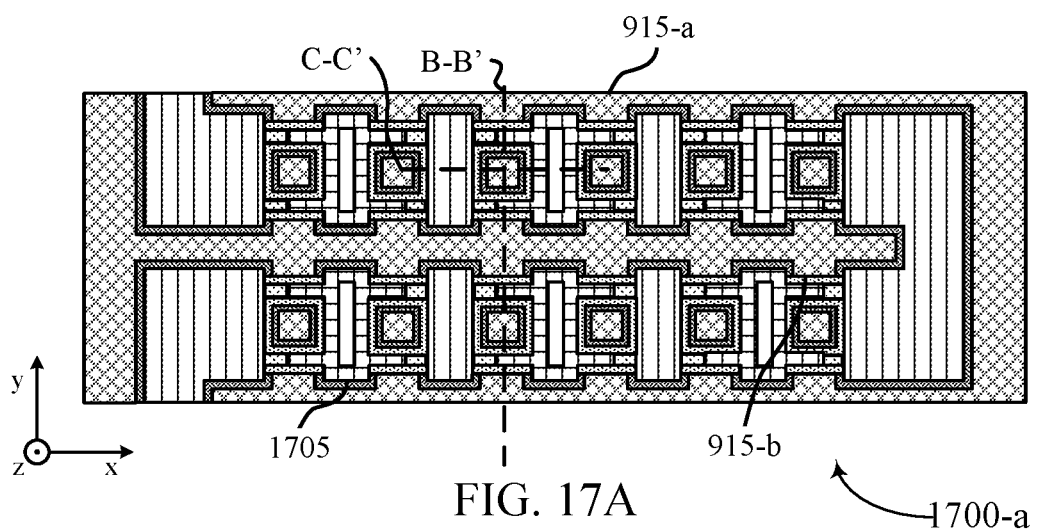
FIGS. 17A, 17B, and 17C illustrate examples of a step of a manufacturing process of a memory array that supports dense piers for three-dimensional memory arrays in accordance with examples as disclosed herein.
Figure 17B:
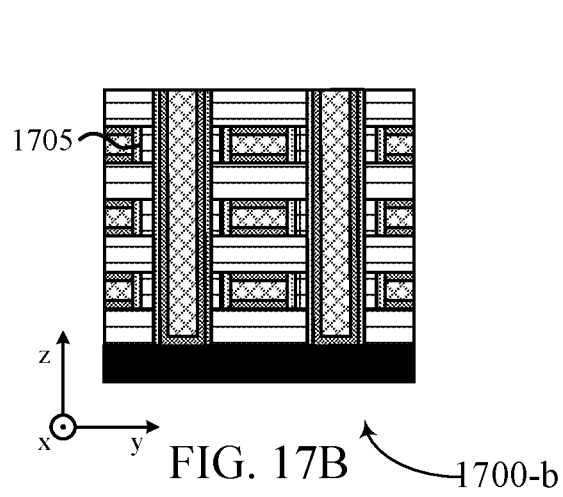
Figure 17C:
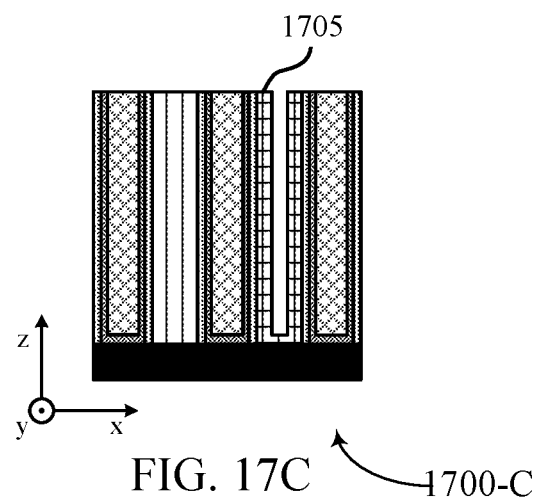

FIGS. 17A, 17B, and 17C illustrate examples of a step of a manufacturing process of a memory array that supports dense piers for three-dimensional memory arrays in accordance with examples as disclosed herein.

FIG. 17A illustrates a top-down view of a step of a manufacturing process of a memory array 1700-a. In some cases, the step of the manufacturing process of the memory array 1700-a may be performed subsequent to the step of the manufacturing process of the memory array 1600 as described with reference to FIG. 16. FIG. 17B illustrates a cross-sectional view a step of a manufacturing process of a memory array 1700-b along section line B-B', while FIG. 17C illustrates a cross-sectional view a step of a manufacturing process of a memory array 1700-c along section line C-C'.

The step of the manufacturing process of the memory array 1700-a may include depositing a storage material 1705 in the set of cavities 1505. In some cases, the storage material 1705 may be a material configured to store a logic state of a memory cell, such as a chalcogenide glass or a chalcogenide alloy. In some examples, the storage material 1705 may be in contact with both of the interleaving comb structures at the step of the manufacturing process illustrated in FIG. 17A. Accordingly, after being deposited, the storage material 1705 may be in contact with both the first word line 915-a and the second word line 915-b.

In some examples, prior to depositing the storage material 1705, the manufacturing process may include pretreating the set of cavities 1505, for example by depositing a sealing layer, or by applying a plasma treatment, such as with ammonia ($NH_3$).

Figure 18A:
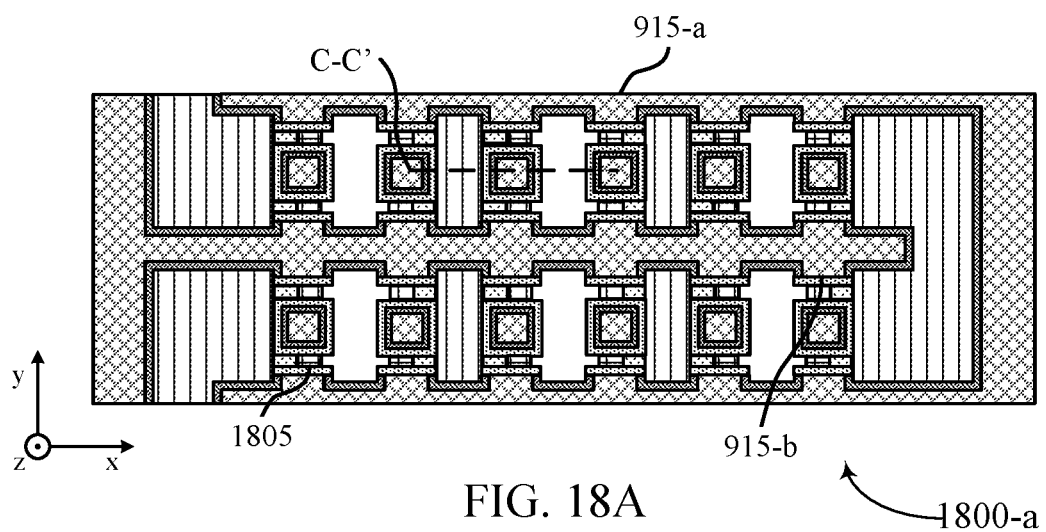
FIGS. 18A and 18B illustrate examples of a step of a manufacturing process of a memory array that supports dense piers for three-dimensional memory arrays in accordance with examples as disclosed herein.
Figure 18B:
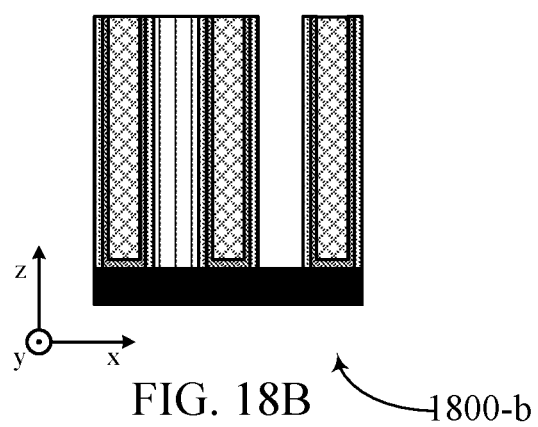

FIGS. 18A and 18B illustrate examples of a step of a manufacturing process of a memory array that supports dense piers for three-dimensional memory arrays in accordance with examples as disclosed herein.

FIG. 18A illustrates a top-down view of a step of a manufacturing process of a memory array 1800-a. In some cases, the step of the manufacturing process of the memory array 1800-a may be performed subsequent to the step of the manufacturing process of the memory array 1700-a as described with reference to FIG. 17A. FIG. 18B illustrates a cross-sectional view a step of the manufacturing process of a memory array 1200-b along section line C-C'.

In some cases, the manufacturing process may include a recess or etch of the storage material 1705. For example, the storage material 1705 may be recessed to form a set of memory cells 1805 in each of the cavities 1505. In some cases, each memory cell 1805 may be coupled with a pillar 1405 and a word line 915-a or 915-b (e.g., a single layer and tine of a comb structure of the set of interleaved comb structures).

Figure 19A:
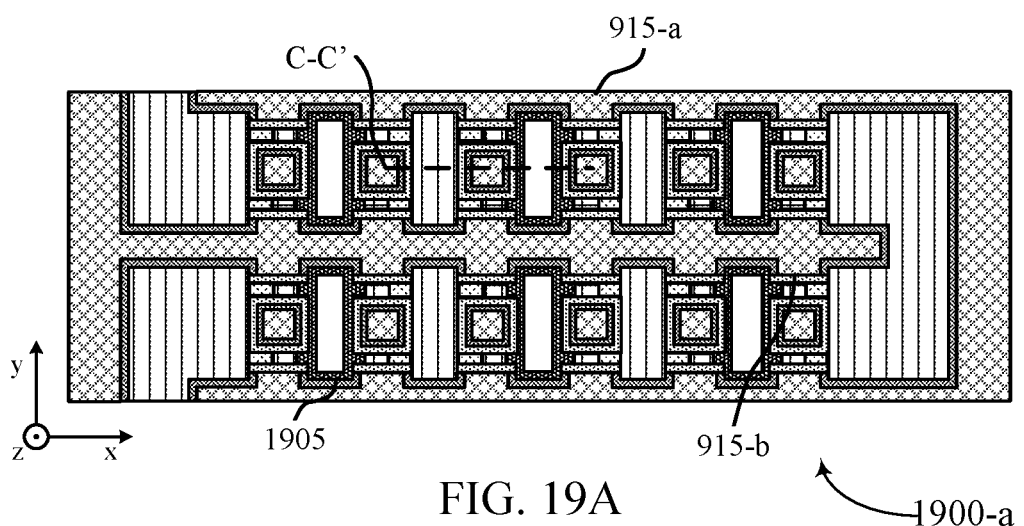
FIGS. 19A and 19 B illustrate examples of a step of a manufacturing process of a memory array that supports dense piers for three-dimensional memory arrays in accordance with examples as disclosed herein.
Figure 19B:
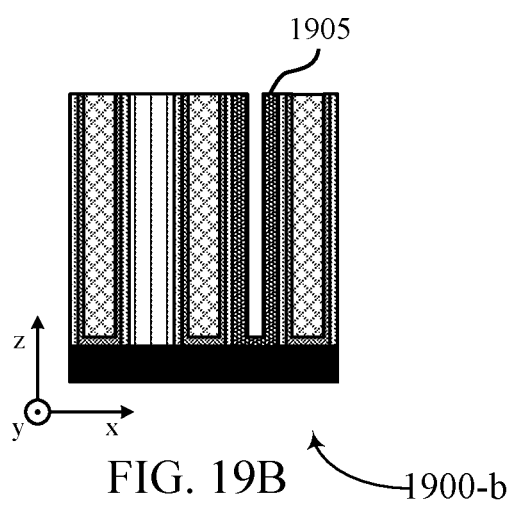

FIGS. 19A and 19B illustrate examples of a step of a manufacturing process of a memory array that supports dense piers for three-dimensional memory arrays in accordance with examples as disclosed herein.

FIG. 19A illustrates a top-down view of a step of a manufacturing process of a memory array 1900-a. In some cases, the step of the manufacturing process of the memory array 1900-a may be performed subsequent to the step of the manufacturing process of the memory array 1800-a as described with reference to FIG. 18A. FIG. 19B illustrates a cross-sectional view a step of a manufacturing process of a memory array 1900-b along section line C-C'.

The step of the manufacturing process of the memory array 1900-a may include depositing a sealing material 1905, which may be an example of a dielectric material, in the set of cavities 1505. In some cases, the sealing material 1905 may be deposited in contact with each memory cell 1805 of each cavity 1505. Additionally, the sealing material 1905 may cover the exposed sidewall of each pillar 1405 (e.g., the sidewall of each pillar 1405 exposed in each cavity 1505). In some examples, the sealing material 1905 may additionally cover the exposed layers of the first material 410 and the barrier material 805 (e.g., the portions exposed by the cavities 1505).

Figure 20A:
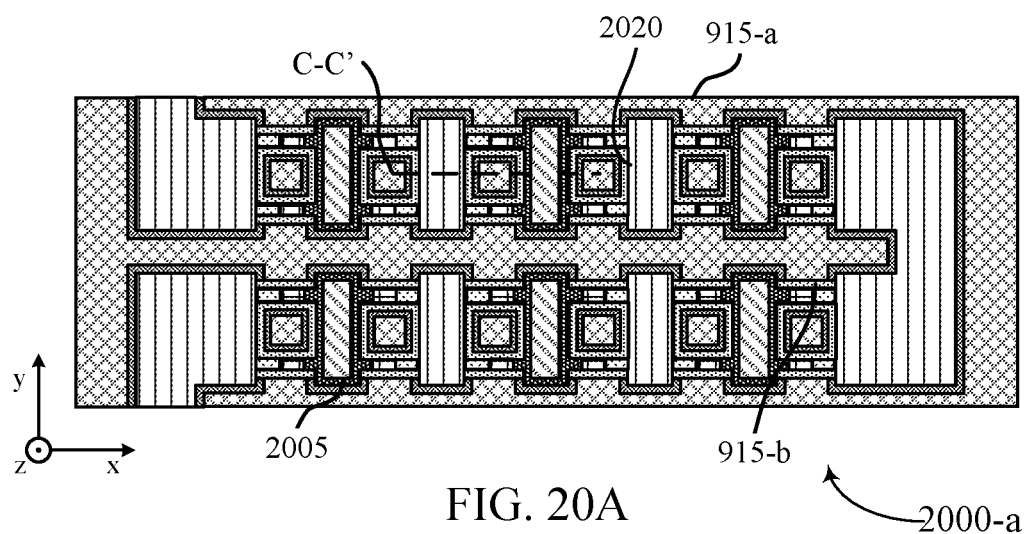
FIGS. 20A and 20B illustrate examples of a step of a manufacturing process of a memory array that supports dense piers for three-dimensional memory arrays in accordance with examples as disclosed herein.
Figure 20B:
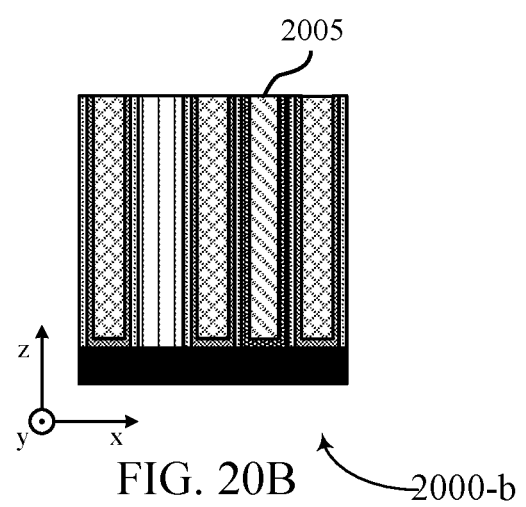

FIGS. 20A and 20B illustrate examples of a step of a manufacturing process of a memory array that supports dense piers for three-dimensional memory arrays in accordance with examples as disclosed herein.

FIG. 20A illustrates a top-down view of a step of a manufacturing process of a memory array 2000-a. In some cases, the step of the manufacturing process of the memory array 2000-a may be performed subsequent to the step of the manufacturing process of the memory array 1900-a as described with reference to FIG. 19A. FIG. 20B illustrates a cross-sectional view a step of a manufacturing process of a memory array 2000-b along section line C-C'.

The step of the manufacturing process of the memory array 2000-a may include depositing a gap fill material 2005 in the set of cavities 1505. In some cases, the gap fill material 2005 may be deposited in contact with the sealing material 1905. Additionally, the gap fill material 2005 may fill the remaining portion of each of the cavities 1505. In some cases, the gap fill material 2005 may be an example of a dielectric material, such as a same material as the piers 505. Alternatively, the gap fill material 2005 may be an example of a different dielectric material.

The sealing material 1905 along with the gap fill material 2005 in each cavity 1505 may form a set of respective dielectric portions. In some cases, forming the set of dielectric portions may further include performing a planarization process, for example, using a CMP procedure, to smooth or polish the top of the memory array 2000-a. In some examples, the dielectric portions may have a length in the y direction which is greater than the length 615 of the cavities 605. That is, the dielectric portions may extend at least partially into the word lines 915-a and 915-b. Accordingly, the dielectric portions may form a single continuous surface between the word lines 915-a and 915-b.

In some examples, manufacturing a memory array, such as the memory array 2000-a, may be performed by manufacturing a set of discrete decks or tiles, which may be joined together to form a memory array. In such examples, different tiles may be isolated from each other, for example by an edge cut. In some cases, the edge cut may be performed using a pier etch (e.g., a same etch used to create the set of cavities 420).

In some examples, a cross-sectional area of piers 505 in an xy-plane may be relatively larger at distances nearer to the substrate 405 (e.g., due to taper along the z-direction resulting from an etching operation to form cavities 605), or edges of piers 505 along an x-direction, along a y-direction, or along a z-direction may be rounded or chamfered (e.g., due to material removal operations or other processing during operations after forming piers 505). In some examples, such tapering, rounding, or chamfering may be apparent at an interface between piers 505 and other materials, including electrode material 1410, barrier material 1415, or sacrificial material 1205, among other interfacing materials deposited after the formation of the piers 505. For example, an interface between piers 505 and electrode material 1510 may have a tapered profile with a positive slope (e.g., a slope that is less than vertical) of a surface of pier 505 and a negative slope (e.g., a slope that is more than vertical) of electrode material 1410 at the interface.

Figure 21:
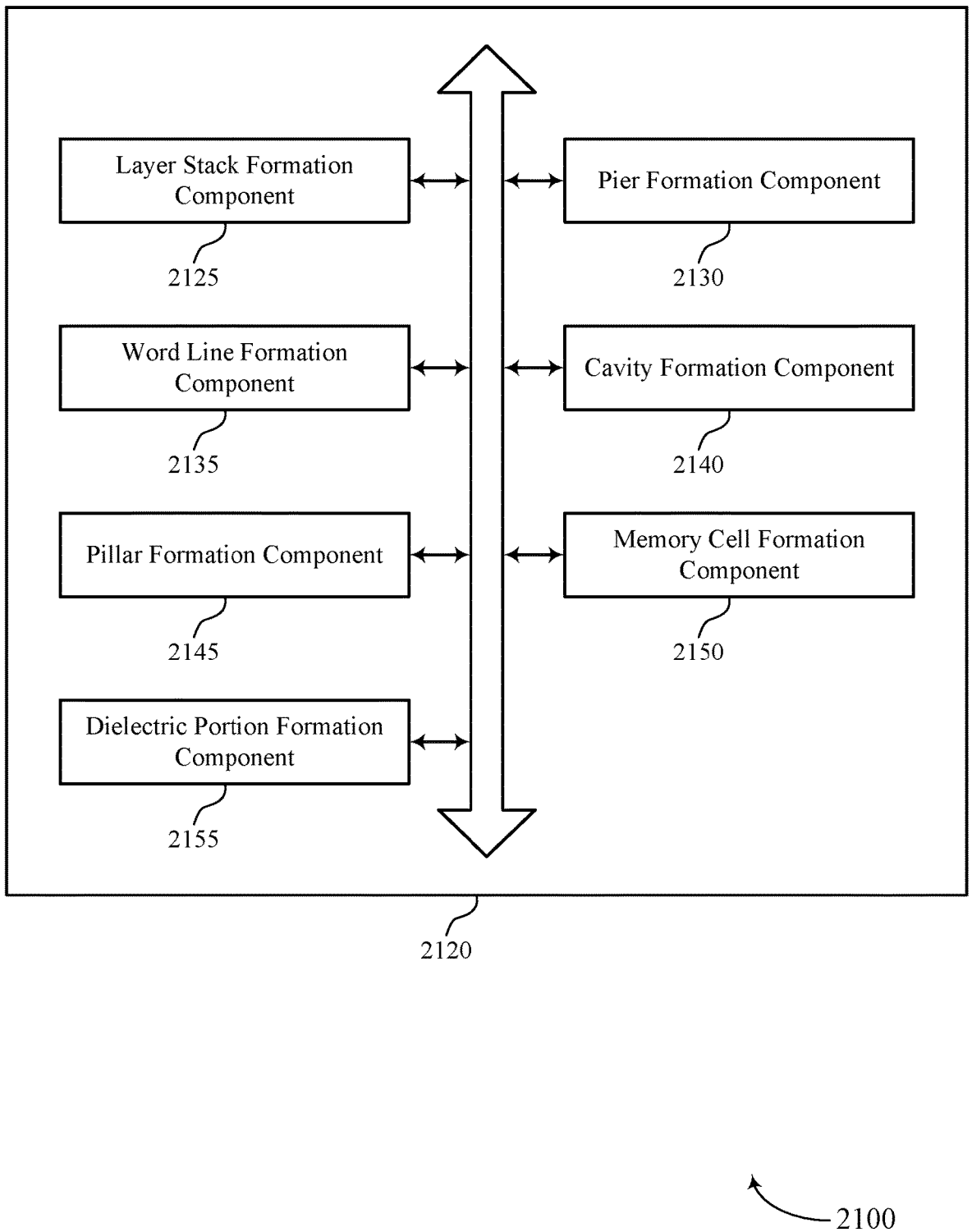
FIG. 21 shows a block diagram of a process controller that supports dense piers for three-dimensional memory arrays in accordance with examples as disclosed herein.

FIG. 21 shows a block diagram 2100 of a process controller 2120 that supports dense piers for three-dimensional memory arrays in accordance with examples as disclosed herein. The process controller 2120 may be an example of aspects of a process controller as described with reference to FIGS. 1 through 20. The process controller 2120, or various components thereof, may be an example of means for performing various aspects of dense piers for three-dimensional memory arrays as described herein. For example, the process controller 2120 may include a layer stack formation component 2125, a pier formation component 2130, a word line formation component 2135, a cavity formation component 2140, a pillar formation component 2145, a memory cell formation component 2150, a dielectric portion formation component 2155, or any combination thereof. Each of these components may communicate, directly or indirectly, with one another (e.g., via one or more buses).

The layer stack formation component 2125 may be configured as or otherwise support a means for depositing a stack of layers over a substrate, the stack of layers including alternating layers of a first material and a second material, where the first material includes a dielectric material. The pier formation component 2130 may be configured as or otherwise support a means for forming a plurality of piers through the stack of layers based at least in part on forming a first plurality of cavities through the stack of layers and filling the first plurality of cavities with a third material, where the third material includes a second dielectric material, and where each of the alternating layers of the first material and the second material is in contact with each pier of the plurality of piers. The word line formation component 2135 may be configured as or otherwise support a means for forming a plurality of first word lines and a plurality of second word lines based at least in part on removing the second material to form an interleaved pair of comb structures including the first material and a first plurality of voids, and depositing a fourth material in the first plurality of voids. The cavity formation component 2140 may be configured as or otherwise support a means for forming a second plurality of cavities through the stack of dielectric layers, where a sidewall of each cavity of the second plurality of cavities is in contact with a sidewall of a respective pier of the plurality of piers. The pillar formation component 2145 may be configured as or otherwise support a means for forming a plurality of pillars in the second plurality of cavities. In some examples, the cavity formation component 2140 may be configured as or otherwise support a means for forming a third plurality of cavities between the plurality of pillars based at least in part on removing at least some of the piers of the plurality of piers, each cavity of the third plurality of cavities exposing a respective first sidewall of a pillar of the plurality of pillars. The memory cell formation component 2150 may be configured as or otherwise support a means for forming a plurality of memory cells based at least in part on depositing a memory material in each cavity of the third plurality of cavities, each memory cell of the plurality of memory cells coupled between a pillar of the plurality of pillars and a word line of the plurality of first word lines or the plurality of second word lines. The dielectric portion formation component 2155 may be configured as or otherwise support a means for forming a plurality of dielectric portions based at least in part on depositing a fourth dielectric material in each cavity of the third plurality of cavities.

In some examples, the dielectric portion formation component 2155 may be configured as or otherwise support a means for forming a plurality of dielectric seals based at least in part on depositing a fifth dielectric material in each cavity of the third plurality of cavities, where forming the plurality of dielectric portions is performed after forming the plurality of dielectric seals.

In some examples, the memory cell formation component 2150 may be configured as or otherwise support a means for depositing an electrode material in each cavity of the second plurality of cavities, the electrode material in contact with a first word line of the plurality of first word lines or a second word line of the plurality of second word lines. In some examples, the memory cell formation component 2150 may be configured as or otherwise support a means for depositing a sacrificial material in contact with the electrode material in each cavity of the second plurality of cavities, where forming the plurality of pillars is performed after depositing the sacrificial material.

In some examples, a length of each cavity of the first plurality of cavities in a first horizontal direction is greater than a length of each cavity of the second plurality of cavities in the first horizontal direction.

In some examples, forming the second plurality of voids includes removing each pier of the plurality of piers.

In some examples, forming the second plurality of voids includes removing alternating piers of the plurality of piers.

In some examples, each cavity of the third plurality of cavities exposes at least portions of respective second and third sidewalls of the pillar of the plurality of pillars.

In some examples, the second dielectric material is the same as the dielectric material.

In some examples, to support forming the plurality of first word lines and forming the plurality of second word lines, the word line formation component 2135 may be configured as or otherwise support a means for depositing a barrier material in contact with the layers of the first material of the first comb structure and in contact with the layers of the first material of the second comb structure. In some examples, to support forming the plurality of first word lines and forming the plurality of second word lines, the word line formation component 2135 may be configured as or otherwise support a means for depositing a conductive material in contact with the barrier material to fill remaining portions of the first plurality of voids.

In some examples, to support forming the plurality of pillars, the pillar formation component 2145 may be configured as or otherwise support a means for depositing an electrode material in contact with walls of the plurality of second cavities. In some examples, to support forming the plurality of pillars, the pillar formation component 2145 may be configured as or otherwise support a means for depositing a barrier material in contact with the layers of the electrode material in each of the plurality of second cavities. In some examples, to support forming the plurality of pillars, the pillar formation component 2145 may be configured as or otherwise support a means for depositing a conductive material in contact with the barrier material to fill remaining portions of the plurality of second cavities.

In some examples, the memory material includes a chalcogenide.

Figure 22:
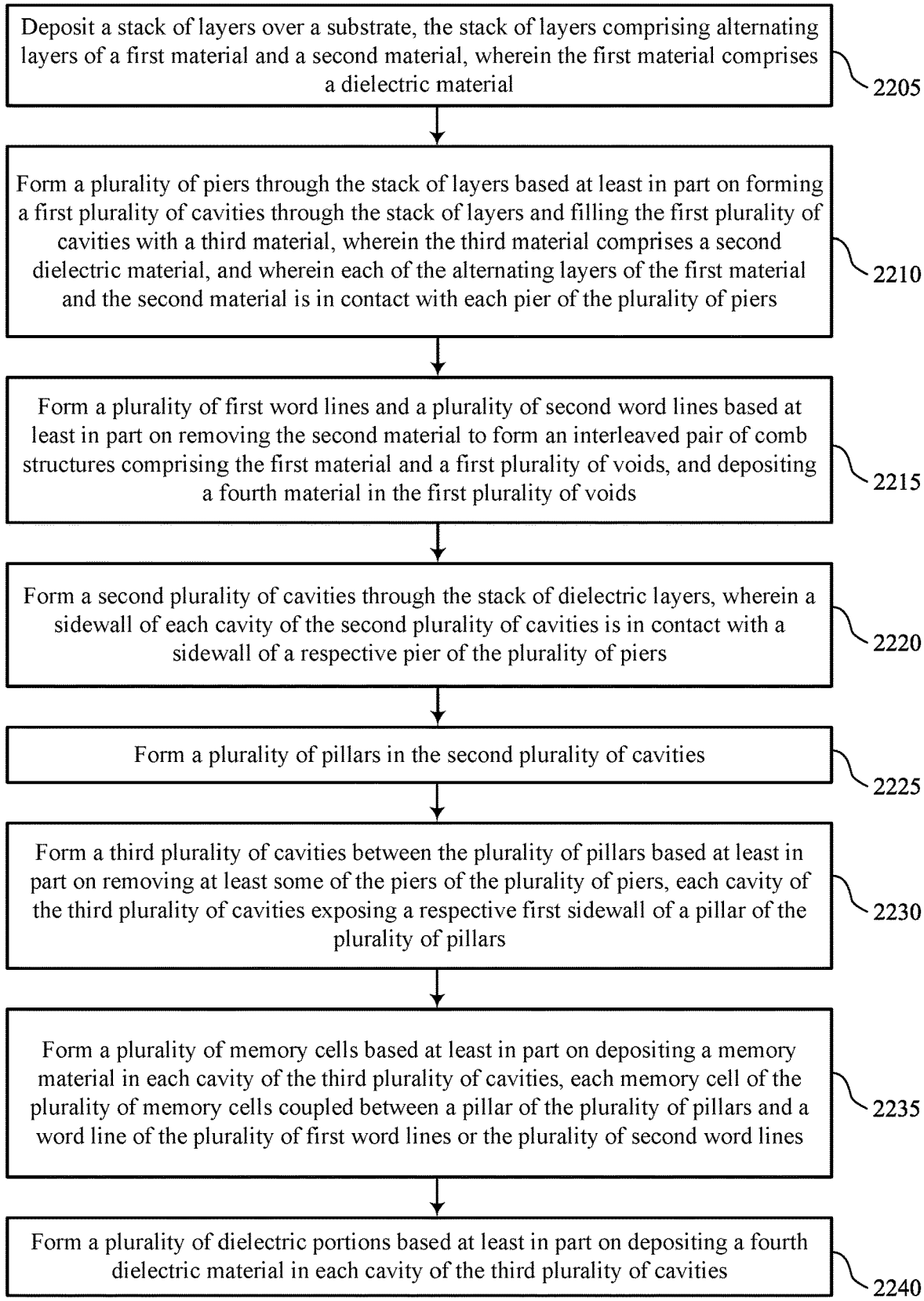
FIG. 22 shows a flowchart illustrating a method or methods that support dense piers for three-dimensional memory arrays in accordance with examples as disclosed herein.

FIG. 22 shows a flowchart illustrating a method 2200 that supports dense piers for three-dimensional memory arrays in accordance with examples as disclosed herein. The operations of method 2200 may be implemented by a process controller or its components as described herein. For example, the operations of method 2200 may be performed by a process controller as described with reference to FIGS. 1 through 21. In some examples, a process controller may execute a set of instructions to control the functional elements of the device to perform the described functions. Additionally or alternatively, the process controller may perform aspects of the described functions using special-purpose hardware.

At 2205, the method may include depositing a stack of layers over a substrate, the stack of layers including alternating layers of a first material and a second material, where the first material includes a dielectric material. The operations of 2205 may be performed in accordance with examples as disclosed herein. In some examples, aspects of the operations of 2205 may be performed by a layer stack formation component 2125 as described with reference to FIG. 21.

At 2210, the method may include forming a plurality of piers through the stack of layers based at least in part on forming a first plurality of cavities through the stack of layers and filling the first plurality of cavities with a third material, where the third material includes a second dielectric material, and where each of the alternating layers of the first material and the second material is in contact with each pier of the plurality of piers. The operations of 2210 may be performed in accordance with examples as disclosed herein. In some examples, aspects of the operations of 2210 may be performed by a pier formation component 2130 as described with reference to FIG. 21.

At 2215, the method may include forming a plurality of first word lines and a plurality of second word lines based at least in part on removing the second material to form an interleaved pair of comb structures including the first material and a first plurality of voids, and depositing a fourth material in the first plurality of voids. The operations of 2215 may be performed in accordance with examples as disclosed herein. In some examples, aspects of the operations of 2215 may be performed by a word line formation component 2135 as described with reference to FIG. 21.

At 2220, the method may include forming a second plurality of cavities through the stack of dielectric layers, where a sidewall of each cavity of the second plurality of cavities is in contact with a sidewall of a respective pier of the plurality of piers. The operations of 2220 may be performed in accordance with examples as disclosed herein. In some examples, aspects of the operations of 2220 may be performed by a cavity formation component 2140 as described with reference to FIG. 21.

At 2225, the method may include forming a plurality of pillars in the second plurality of cavities. The operations of 2225 may be performed in accordance with examples as disclosed herein. In some examples, aspects of the operations of 2225 may be performed by a pillar formation component 2145 as described with reference to FIG. 21.

At 2230, the method may include forming a third plurality of cavities between the plurality of pillars based at least in part on removing at least some of the piers of the plurality of piers, each cavity of the third plurality of cavities exposing a respective first sidewall of a pillar of the plurality of pillars. The operations of 2230 may be performed in accordance with examples as disclosed herein. In some examples, aspects of the operations of 2230 may be performed by a cavity formation component 2140 as described with reference to FIG. 21.

At 2235, the method may include forming a plurality of memory cells based at least in part on depositing a memory material in each cavity of the third plurality of cavities, each memory cell of the plurality of memory cells coupled between a pillar of the plurality of pillars and a word line of the plurality of first word lines or the plurality of second word lines. The operations of 2235 may be performed in accordance with examples as disclosed herein. In some examples, aspects of the operations of 2235 may be performed by a memory cell formation component 2150 as described with reference to FIG. 21.

At 2240, the method may include forming a plurality of dielectric portions based at least in part on depositing a fourth dielectric material in each cavity of the third plurality of cavities. The operations of 2240 may be performed in accordance with examples as disclosed herein. In some examples, aspects of the operations of 2240 may be performed by a dielectric portion formation component 2155 as described with reference to FIG. 21.

In some examples, an apparatus as described herein may perform a method or methods, such as the method 2200. The apparatus may include features, circuitry, logic, means, or instructions (e.g., a non-transitory computer-readable medium storing instructions executable by a processor), or any combination thereof for performing the following aspects of the present disclosure:

Aspect 1: A method, apparatus, or non-transitory computer-readable medium including operations, features, circuitry, logic, means, or instructions, or any combination thereof for depositing a stack of layers over a substrate, the stack of layers including alternating layers of a first material and a second material, where the first material includes a dielectric material; forming a plurality of piers through the stack of layers based at least in part on forming a first plurality of cavities through the stack of layers and filling the first plurality of cavities with a third material, where the third material includes a second dielectric material, and where each of the alternating layers of the first material and the second material is in contact with each pier of the plurality of piers; forming a plurality of first word lines and a plurality of second word lines based at least in part on removing the second material to form an interleaved pair of comb structures including the first material and a first plurality of voids, and depositing a fourth material in the first plurality of voids; forming a second plurality of cavities through the stack of dielectric layers, where a sidewall of each cavity of the second plurality of cavities is in contact with a sidewall of a respective pier of the plurality of piers; forming a plurality of pillars in the second plurality of cavities; forming a third plurality of cavities between the plurality of pillars based at least in part on removing at least some of the piers of the plurality of piers, each cavity of the third plurality of cavities exposing a respective first sidewall of a pillar of the plurality of pillars; forming a plurality of memory cells based at least in part on depositing a memory material in each cavity of the third plurality of cavities, each memory cell of the plurality of memory cells coupled between a pillar of the plurality of pillars and a word line of the plurality of first word lines or the plurality of second word lines; and forming a plurality of dielectric portions based at least in part on depositing a fourth dielectric material in each cavity of the third plurality of cavities.

Aspect 2: The method, apparatus, or non-transitory computer-readable medium of aspect 1, further including operations, features, circuitry, logic, means, or instructions, or any combination thereof for forming a plurality of dielectric seals based at least in part on depositing a fifth dielectric material in each cavity of the third plurality of cavities, where forming the plurality of dielectric portions is performed after forming the plurality of dielectric seals.

Aspect 3: The method, apparatus, or non-transitory computer-readable medium of any of aspects 1 through 2, further including operations, features, circuitry, logic, means, or instructions, or any combination thereof for depositing an electrode material in each cavity of the second plurality of cavities, the electrode material in contact with a first word line of the plurality of first word lines or a second word line of the plurality of second word lines and depositing a sacrificial material in contact with the electrode material in each cavity of the second plurality of cavities, where forming the plurality of pillars is performed after depositing the sacrificial material.

Aspect 4: The method, apparatus, or non-transitory computer-readable medium of any of aspects 1 through 3 where a length of each cavity of the first plurality of cavities in a first horizontal direction is greater than a length of each cavity of the second plurality of cavities in the first horizontal direction.

Aspect 5: The method, apparatus, or non-transitory computer-readable medium of any of aspects 1 through 4 where forming the second plurality of voids includes removing each pier of the plurality of piers.

Aspect 6: The method, apparatus, or non-transitory computer-readable medium of any of aspects 1 through 5 where forming the second plurality of voids includes removing alternating piers of the plurality of piers.

Aspect 7: The method, apparatus, or non-transitory computer-readable medium of any of aspects 1 through 6 where each cavity of the third plurality of cavities exposes at least portions of respective second and third sidewalls of the pillar of the plurality of pillars.

Aspect 8: The method, apparatus, or non-transitory computer-readable medium of any of aspects 1 through 7 where the second dielectric material is the same as the dielectric material.

Aspect 9: The method, apparatus, or non-transitory computer-readable medium of any of aspects 1 through 8 where forming the plurality of first word lines and forming the plurality of second word lines includes operations, features, circuitry, logic, means, or instructions, or any combination thereof for depositing a barrier material in contact with the layers of the first material of the first comb structure and in contact with the layers of the first material of the second comb structure and depositing a conductive material in contact with the barrier material to fill remaining portions of the first plurality of voids.

Aspect 10: The method, apparatus, or non-transitory computer-readable medium of any of aspects 1 through 9 where forming the plurality of pillars includes operations, features, circuitry, logic, means, or instructions, or any combination thereof for depositing an electrode material in contact with walls of the plurality of second cavities; depositing a barrier material in contact with the layers of the electrode material in each of the plurality of second cavities; and depositing a conductive material in contact with the barrier material to fill remaining portions of the plurality of second cavities.

Aspect 11: The method, apparatus, or non-transitory computer-readable medium of any of aspects 1 through 10 where the memory material includes a chalcogenide.

It should be noted that the methods described herein describe possible implementations, and that the operations and the steps may be rearranged or otherwise modified and that other implementations are possible. Further, portions from two or more of the methods may be combined.

An apparatus is described. The following provides an overview of aspects of the apparatus as described herein:

Aspect 12: An apparatus, including: a plurality of first word lines distributed along a vertical direction relative to a substrate, where each of the plurality of first word lines includes a plurality of first word line members extending in a first horizontal direction relative to the substrate, the plurality of first word lines separated by a dielectric material in the vertical direction; a plurality of second word lines distributed along the vertical direction, where each of the plurality of second word lines includes a plurality of second word line members that are interleaved with the plurality of first word line members for a corresponding first word line of the plurality of first word lines, the plurality of second word line members separated from the plurality the plurality of first word line members in a second horizontal direction perpendicular to the first horizontal direction; a plurality of dielectric structures extending in the vertical direction, each dielectric structure of the plurality of dielectric structures in contact with a word line member of the plurality of first word line members for each of the plurality of first word lines and in contact with a respective second word line member of the plurality of second word line members for each of the plurality of second word lines, where a separation between a portion of the respective first word line member in contact with a dielectric structure and a portion of the respective second word line member in contact with the dielectric structure is a first length along the second horizontal direction and a separation between a portion of the respective first word line member not in contact with the dielectric structure and a portion of the respective second word line member not in contact with the dielectric structure is a second length along the second horizontal direction that is less than the first length; a plurality of conductive pillars between the plurality of first word lines and the plurality of second word lines; a first plurality of memory cells, each memory cell of the first plurality of memory cells electrically coupled with a respective word line of the plurality of first word lines and a respective pillar of the plurality of conductive pillars; and a second plurality of memory cells, each memory cell of the second plurality of memory cells electrically coupled with a respective word line of the plurality of second word lines and a respective pillar of the plurality of conductive pillars.

Aspect 13: The apparatus of aspect 12, where the plurality of dielectric structures includes: a first plurality of dielectric portions between a first plurality of adjacent pairs of the plurality of conductive pillars, each of the first plurality of dielectric portions having sidewalls that are a single continuous surface between a plurality of first word line members and a plurality of second word line members; and a second plurality of dielectric portions between a second plurality of adjacent pairs of the plurality of conductive pillars, each of the second plurality of dielectric portions having extensions that extend at least partially between a conductive pillar of the plurality of conductive pillars and the plurality of first word line members and at least partially between the conductive pillar and the plurality of second word line members.

Aspect 14: The apparatus of aspect 13, where each of the extensions of the second plurality of dielectric portions is in contact with one or more of the first plurality of memory cells or one or more of the second plurality of memory cells.

Aspect 15: The apparatus of any of aspects 13 through 14, where each of the second plurality of dielectric portions includes a dielectric seal material and an oxide material.

Aspect 16: The apparatus of aspect 15, where the dielectric seal material forms a perimeter of the second plurality of dielectric portions.

Aspect 17: The apparatus of any of aspects 13 through 16, where each of the first plurality of dielectric portions is separated from one or more of the first plurality of memory cells that are coupled with a first one of the first plurality of adjacent pairs of the plurality of conductive pillars by a material that is different from a material of the first plurality of dielectric portions.

Aspect 18: The apparatus of any of aspects 12 through 17, further including: a plurality of dielectric seals, each dielectric seal of the plurality of dielectric seals between a respective dielectric portion of the plurality of dielectric portions and a respective conductive pillar of the plurality of conductive pillars.

Aspect 19: The apparatus of any of aspects 12 through 18, where each of the plurality of dielectric structures have a third length in the second horizontal direction, the third length greater than the second length.

An apparatus is described. The following provides an overview of aspects of the apparatus as described herein:

Aspect 20: An apparatus having a memory array formed by a process including: depositing a stack of layers over a substrate, the stack of layers including alternating layers of a first material and a second material, where the first material includes a dielectric material; forming a plurality of piers through the stack of layers based at least in part on forming a first plurality of cavities through the stack of layers and filling the first plurality of cavities with a third material, where the third material includes a second dielectric material, and where each of the alternating layers of the first material and the second material is in contact with each pier of the plurality of piers; forming a plurality of first word lines and a plurality of second word lines based at least in part on removing the second material to form an interleaved pair of comb structures including the first material and a first plurality of voids, and depositing a fourth material in the first plurality of voids; forming a second plurality of cavities through the stack of dielectric layers, where a sidewall of each cavity of the second plurality of cavities is in contact with a sidewall of a respective pier of the plurality of piers; forming a plurality of pillars in the second plurality of cavities; forming a third plurality of cavities between the plurality of pillars based at least in part on removing at least some of the piers of the plurality of piers, each cavity of the third plurality of cavities exposing a respective sidewall of a pillar of the plurality of pillars; forming a plurality of memory cells between pillars and word lines based at least in part on depositing a memory material in each cavity of the third plurality of cavities, each pillar of the plurality of pillars coupled with a respective first memory cell of the plurality of memory cells and coupled with a respective second memory cell of the plurality of memory cells; and forming a plurality of dielectric portions based at least in part on depositing a fourth dielectric material in each cavity of the third plurality of cavities.

Aspect 21: The apparatus of aspect 20, where the process further includes: forming a plurality of dielectric seals based at least in part on depositing a fifth dielectric material in each cavity of the third plurality of cavities, where forming the plurality of dielectric portions is performed after forming the plurality of dielectric seals.

Aspect 22: The apparatus of any of aspects 20 through 21, where the process further includes: depositing an electrode material in each cavity of the second plurality of cavities, the electrode material in contact with a first word line of the plurality of first word lines or a second word line of the plurality of second word lines; and depositing a sacrificial material in contact with the electrode material in each of cavity of the second plurality of cavities, where forming the plurality of pillars is performed after depositing the sacrificial material.

Aspect 23: The apparatus of any of aspects 20 through 22, where a length of each cavity of the first plurality of cavities in a first horizontal direction is greater than a length of each cavity of the second plurality of cavities in the first horizontal direction.

Aspect 24: The apparatus of any of aspects 20 through 23, where forming the third plurality of cavities includes removing each pier of the plurality of piers.

Aspect 25: The apparatus of any of aspects 20 through 24, where forming the third plurality of cavities includes removing alternating piers of the plurality of piers.

Information and signals described herein may be represented using any of a variety of different technologies and techniques. For example, data, instructions, commands, information, signals, bits, symbols, and chips that may be referenced throughout the above description may be represented by voltages, currents, electromagnetic waves, magnetic fields or particles, optical fields or particles, or any combination thereof. Some drawings may illustrate signals as a single signal; however, the signal may represent a bus of signals, where the bus may have a variety of bit widths.

The terms "electronic communication," "conductive contact," "connected," and "coupled" may refer to a relationship between components that supports the flow of signals between the components. Components are considered in electronic communication with (or in conductive contact with or connected with or coupled with) one another if there is any conductive path between the components that can, at any time, support the flow of signals between the components. At any given time, the conductive path between components that are in electronic communication with each other (or in conductive contact with or connected with or coupled with) may be an open circuit or a closed circuit based on the operation of the device that includes the connected components. The conductive path between connected components may be a direct conductive path between the components or the conductive path between connected components may be an indirect conductive path that may include intermediate components, such as switches, transistors, or other components. In some examples, the flow of signals between the connected components may be interrupted for a time, for example, using one or more intermediate components such as switches or transistors.

The term "coupling" refers to condition of moving from an open-circuit relationship between components in which signals are not presently capable of being communicated between the components over a conductive path to a closed-circuit relationship between components in which signals are capable of being communicated between components over the conductive path. When a component, such as a controller, couples other components together, the component initiates a change that allows signals to flow between the other components over a conductive path that previously did not permit signals to flow.

The term "isolated" refers to a relationship between components in which signals are not presently capable of flowing between the components. Components are isolated from each other if there is an open circuit between them. For example, two components separated by a switch that is positioned between the components are isolated from each other when the switch is open. When a controller isolates two components, the controller affects a change that prevents signals from flowing between the components using a conductive path that previously permitted signals to flow.

The term "layer" or "level" used herein refers to a stratum or sheet of a geometrical structure (e.g., relative to a substrate). Each layer or level may have three dimensions (e.g., height, width, and depth) and may cover at least a portion of a surface. For example, a layer or level may be a three-dimensional structure where two dimensions are greater than a third, e.g., a thin-film. Layers or levels may include different elements, components, or materials. In some examples, one layer or level may be composed of two or more sublayers or sublevels.

As used herein, the term "electrode" may refer to an electrical conductor, and in some examples, may be employed as an electrical contact to a memory cell or other component of a memory array. An electrode may include a trace, wire, conductive line, conductive layer, or the like that provides a conductive path between elements or components of a memory array.

The devices discussed herein, including a memory array, may be formed on a semiconductor substrate, such as silicon, germanium, silicon-germanium alloy, gallium arsenide, gallium nitride, etc. In some examples, the substrate is a semiconductor wafer. In other examples, the substrate may be a silicon-on-insulator (SOI) substrate, such as silicon-on-glass (SOG) or silicon-on-sapphire (SOP), or epitaxial layers of semiconductor materials on another substrate. The conductivity of the substrate, or sub-regions of the substrate, may be controlled through doping using various chemical species including, but not limited to, phosphorous, boron, or arsenic. Doping may be performed during the initial formation or growth of the substrate, by ion-implantation, or by any other doping means.

A switching component or a transistor discussed herein may represent a field-effect transistor (FET) and comprise a three terminal device including a source, drain, and gate. The terminals may be connected to other electronic elements through conductive materials, e.g., metals. The source and drain may be conductive and may comprise a heavily-doped, e.g., degenerate, semiconductor region. The source and drain may be separated by a lightly-doped semiconductor region or channel. If the channel is n-type (i.e., majority carriers are electrons), then the FET may be referred to as a n-type FET. If the channel is p-type (i.e., majority carriers are holes), then the FET may be referred to as a p-type FET. The channel may be capped by an insulating gate oxide. The channel conductivity may be controlled by applying a voltage to the gate. For example, applying a positive voltage or negative voltage to an n-type FET or a p-type FET, respectively, may result in the channel becoming conductive. A transistor may be "on" or "activated" when a voltage greater than or equal to the transistor's threshold voltage is applied to the transistor gate. The transistor may be "off" or "deactivated" when a voltage less than the transistor's threshold voltage is applied to the transistor gate.

The description set forth herein, in connection with the appended drawings, describes example configurations and does not represent all the examples that may be implemented or that are within the scope of the claims. The term "exemplary" used herein means "serving as an example, instance, or illustration," and not "preferred" or "advantageous over other examples." The detailed description includes specific details to providing an understanding of the described techniques. These techniques, however, may be practiced without these specific details. In some instances, well-known structures and devices are shown in block diagram form to avoid obscuring the concepts of the described examples.

In the appended figures, similar components or features may have the same reference label. Further, various components of the same type may be distinguished by following the reference label by a dash and a second label that distinguishes among the similar components. If just the first reference label is used in the specification, the description is applicable to any one of the similar components having the same first reference label irrespective of the second reference label.

The functions described herein may be implemented in hardware, software executed by a processor, firmware, or any combination thereof. If implemented in software executed by a processor, the functions may be stored on or transmitted over as one or more instructions or code on a computer-readable medium. Other examples and implementations are within the scope of the disclosure and appended claims. For example, due to the nature of software, functions described herein can be implemented using software executed by a processor, hardware, firmware, hardwiring, or combinations of any of these. Features implementing functions may also be physically located at various positions, including being distributed such that portions of functions are implemented at different physical locations.

For example, the various illustrative blocks and modules described in connection with the disclosure herein may be implemented or performed with a general-purpose processor, a DSP, an ASIC, an FPGA or other programmable logic device, discrete gate or transistor logic, discrete hardware components, or any combination thereof designed to perform the functions described herein. A general-purpose processor may be a microprocessor, but in the alternative, the processor may be any processor, controller, microcontroller, or state machine. A processor may also be implemented as a combination of computing devices (e.g., a combination of a DSP and a microprocessor, multiple microprocessors, one or more microprocessors in conjunction with a DSP core, or any other such configuration).

As used herein, including in the claims, "or" as used in a list of items (for example, a list of items prefaced by a phrase such as "at least one of" or "one or more of") indicates an inclusive list such that, for example, a list of at least one of A, B, or C means A or B or C or AB or AC or BC or ABC (i.e., A and B and C). Also, as used herein, the phrase "based on" shall not be construed as a reference to a closed set of conditions. For example, an exemplary step that is described as "based on condition A" may be based on both a condition A and a condition B without departing from the scope of the present disclosure. In other words, as used herein, the phrase "based on" shall be construed in the same manner as the phrase "based at least in part on."

Computer-readable media includes both non-transitory computer storage media and communication media including any medium that facilitates transfer of a computer program from one place to another. A non-transitory storage medium may be any available medium that can be accessed by a general purpose or special purpose computer. By way of example, and not limitation, non-transitory computer-readable media can comprise RAM, ROM, electrically erasable programmable read-only memory (EEPROM), compact disk (CD) ROM or other optical disk storage, magnetic disk storage or other magnetic storage devices, or any other non-transitory medium that can be used to carry or store desired program code means in the form of instructions or data structures and that can be accessed by a general-purpose or special-purpose computer, or a general-purpose or special-purpose processor. Also, any connection is properly termed a computer-readable medium. For example, if the software is transmitted from a website, server, or other remote source using a coaxial cable, fiber optic cable, twisted pair, digital subscriber line (DSL), or wireless technologies such as infrared, radio, and microwave, then the coaxial cable, fiber optic cable, twisted pair, digital subscriber line (DSL), or wireless technologies such as infrared, radio, and microwave are included in the definition of medium. Disk and disc, as used herein, include CD, laser disc, optical disc, digital versatile disc (DVD), floppy disk and Blu-ray disc where disks usually reproduce data magnetically, while discs reproduce data optically with lasers. Combinations of the above are also included within the scope of computer-readable media.

The description herein is provided to enable a person skilled in the art to make or use the disclosure. Various modifications to the disclosure will be apparent to those skilled in the art, and the generic principles defined herein may be applied to other variations without departing from the scope of the disclosure. Thus, the disclosure is not limited to the examples and designs described herein, but is to be accorded the broadest scope consistent with the principles and novel features disclosed herein.

What is claimed is:

1. A method, comprising:
    depositing a stack of layers over a substrate, the stack of layers comprising alternating layers of a first material and a second material, wherein the first material comprises a dielectric material;
    forming a plurality of piers through the stack of layers based at least in part on forming a first plurality of cavities through the stack of layers and filling the first plurality of cavities with a third material, wherein the third material comprises a second dielectric material, and wherein each of the alternating layers of the first material and the second material is in contact with each pier of the plurality of piers;
    forming a plurality of first word lines and a plurality of second word lines based at least in part on removing the second material to form an interleaved pair of comb structures comprising the first material and a first plurality of voids, and depositing a fourth material in the first plurality of voids;
    forming a second plurality of cavities through the stack of layers, wherein a sidewall of each cavity of the second plurality of cavities is in contact with a sidewall of a respective pier of the plurality of piers;
    forming a plurality of pillars in the second plurality of cavities;
    forming a third plurality of cavities between the plurality of pillars based at least in part on removing at least some of the piers of the plurality of piers, each cavity of the third plurality of cavities exposing a respective first sidewall of a pillar of the plurality of pillars;
    forming a plurality of memory cells based at least in part on depositing a memory material in each cavity of the third plurality of cavities, each memory cell of the plurality of memory cells coupled between a pillar of the plurality of pillars and a word line of the plurality of first word lines or the plurality of second word lines; and
    forming a plurality of dielectric portions based at least in part on depositing a fourth dielectric material in each cavity of the third plurality of cavities.

2. The method of claim 1, further comprising:
    forming a plurality of dielectric seals based at least in part on depositing a fifth dielectric material in each cavity of the third plurality of cavities, wherein forming the plurality of dielectric portions is performed after forming the plurality of dielectric seals.

3. The method of claim 1, further comprising:
    depositing an electrode material in each cavity of the second plurality of cavities, the electrode material in contact with a first word line of the plurality of first word lines or a second word line of the plurality of second word lines; and depositing a sacrificial material in contact with the electrode material in each cavity of the second plurality of cavities, wherein forming the plurality of pillars is performed after depositing the sacrificial material.

4. The method of claim 1, wherein a length of each cavity of the first plurality of cavities in a first horizontal direction is greater than a length of each cavity of the second plurality of cavities in the first horizontal direction.

5. The method of claim 1, wherein forming the third plurality of cavities comprises removing each pier of the plurality of piers.

6. The method of claim 1, wherein forming the third plurality of cavities comprises removing alternating piers of the plurality of piers.

7. The method of claim 1, wherein each cavity of the third plurality of cavities exposes at least portions of respective second and third sidewalls of the pillar of the plurality of pillars.

8. The method of claim 1, wherein the second dielectric material is the same as the dielectric material.

9. The method of claim 1, wherein forming the plurality of first word lines and forming the plurality of second word lines comprises:

depositing a barrier material in contact with the layers of the first material of a first comb structure of the interleaved pair of comb structures and in contact with the layers of the first material of a second comb structure of the interleaved pair of comb structures; and depositing a conductive material in contact with the barrier material to fill remaining portions of the first plurality of voids.

10. The method of claim 1, wherein forming the plurality of pillars comprises:

depositing an electrode material in contact with walls of the second plurality of cavities;

depositing a barrier material in contact with the layers of the electrode material in each of the second plurality of cavities; and depositing a conductive material in contact with barrier material to fill remaining portions of the second plurality of cavities.

11. The method of claim 1, wherein the memory material comprises a chalcogenide.

* * * * *